United States Patent
Kessler et al.

(10) Patent No.: US 10,707,422 B2
(45) Date of Patent: Jul. 7, 2020

(54) PRODUCTION OF ORGANIC PHOSPHORESCENT LAYERS WITH ADDITION OF HEAVY MAIN GROUP METAL COMPLEXES

(71) Applicant: Siemens Aktiengesellschaft, Munich (DE)

(72) Inventors: Florian Kessler, Hoechstadt an der Aisch (DE); Ana-Maria Krestel, Erlangen (DE); Anna Maltenberger, Leutenbach (DE); Guenter Schmid, Hemhofen (DE); Dan Taroata, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 320 days.

(21) Appl. No.: 14/909,996

(22) PCT Filed: May 8, 2014

(86) PCT No.: PCT/EP2014/059463
§ 371 (c)(1),
(2) Date: Feb. 4, 2016

(87) PCT Pub. No.: WO2015/018539
PCT Pub. Date: Feb. 12, 2015

(65) Prior Publication Data
US 2016/0181540 A1     Jun. 23, 2016

(30) Foreign Application Priority Data
Aug. 5, 2013   (DE) .................. 10 2013 215 342

(51) Int. Cl.
*H01L 51/00* (2006.01)
*C09K 11/06* (2006.01)
(Continued)

(52) U.S. Cl.
CPC .......... *H01L 51/0051* (2013.01); *C09K 11/06* (2013.01); *H01L 51/0077* (2013.01);
(Continued)

(58) Field of Classification Search
CPC ............ C09K 2211/188; H01L 51/506; H01L 51/5024; H01L 51/5052; H01L 51/5076; H01L 51/0077–0092
See application file for complete search history.

(56) References Cited

U.S. PATENT DOCUMENTS 6,902,830 B2   6/2005  Thompson
6,911,271 B1   6/2005  Lamansky
(Continued)

FOREIGN PATENT DOCUMENTS

DE       10360681 A1   7/2005   ............. C09K 11/06
DE     102006023508 A1  1/2007   ............. C09K 11/06
(Continued)

OTHER PUBLICATIONS

F. P. Schwarz and S. P. Wasik, "Fluorescence measurements of benzene, naphthalene, anthracene, pyrene, fluoranthene, and benzo[e]pyrene in water", Analytical Chemistry 48(3) p. 524-528 (Year: 1976).*
(Continued)

*Primary Examiner* — Eric R Smith
(74) *Attorney, Agent, or Firm* — Slayden Grubert Beard PLLC

(57) ABSTRACT

A method is provided for producing organic electrical layers having organic emitters that are phosphorescent at room temperature. Organic fluorescent emitters, together with organic complex ligands containing metal complexes, and at least one heavy main group metal, selected from the group comprising In, Tl, Sn, Pb, Sb and Bi, are deposited jointly inside a layer, and the heavy main group metal changes its
(Continued)

coordination sphere by receiving the organic fluorescent emitter.

15 Claims, 13 Drawing Sheets

(51) Int. Cl.
*H01L 51/50* (2006.01)
*H01L 51/56* (2006.01)

(52) U.S. Cl.
CPC .. *H01L 51/5016* (2013.01); *C09K 2211/1007* (2013.01); *C09K 2211/1029* (2013.01); *C09K 2211/1044* (2013.01); *C09K 2211/188* (2013.01); *H01L 51/0072* (2013.01); *H01L 51/56* (2013.01); *Y02E 10/549* (2013.01)

(56) References Cited

U.S. PATENT DOCUMENTS

| | | | | |
|---|---|---|---|---|
| 7,943,244 | B2 | 5/2011 | Aziz et al. | 428/690 |
| 8,809,566 | B2 | 8/2014 | Stoessel et al. | 556/400 |
| 9,435,021 | B2 | 9/2016 | Thompson | |
| 2002/0045065 | A1* | 4/2002 | Kim | C07D 215/36 428/690 |
| 2003/0017361 | A1* | 1/2003 | Thompson | C07D 209/86 428/690 |
| 2004/0086742 | A1* | 5/2004 | Ma | C07F 15/004 428/690 |
| 2005/0129978 | A1 | 6/2005 | Nakashima et al. | 428/690 |
| 2006/0263628 | A1* | 11/2006 | Aziz | H01L 51/5206 428/690 |
| 2009/0058279 | A1* | 3/2009 | Takeda | C09K 11/06 313/504 |
| 2012/0045862 | A1* | 2/2012 | Thompson | C07F 1/005 438/46 |
| 2012/0119191 | A1 | 5/2012 | Dorok et al. | 257/40 |
| 2012/0187827 | A1* | 7/2012 | Hunze | H01L 51/5012 313/506 |
| 2012/0286254 | A1* | 11/2012 | Stoessel | H01L 51/0083 257/40 |
| 2013/0001472 | A1 | 1/2013 | Ohshita et al. | 252/301.16 |

FOREIGN PATENT DOCUMENTS

| | | | | |
|---|---|---|---|---|
| DE | 102009022858 | A1 | 12/2011 | ............ C07F 9/6584 |
| DE | 112011100845 | T5 | 1/2013 | ............ C07F 9/94 |
| JP | 2002110357 | A | 4/2002 | ............ C09K 11/06 |
| WO | WO-2005061654 | A1 * | 7/2005 | ............ C09K 11/06 |
| WO | WO-2011111621 | A1 * | 9/2011 | ................ C07F 9/94 |
| WO | 2012/016074 | A1 | 2/2012 | ................ B05D 7/24 |
| WO | 2015/018539 | A1 | 2/2015 | ............. C09K 11/06 |

OTHER PUBLICATIONS

Z. Q. Gao et al., "New host containing bipolar carrier transport moiety for high-efficiency electrophosphorescence at low voltages", Advanced Materials 20 p. 688-692 (Year: 2009).*

V. N. Salimgareeva, et al., "2-phenyl-5-(4-biphenylyl)-1,3,4-oxadiazole and 2-(4'-tert-butylphenyl-5)-(4"biphenylyl)-1,3,4-oxadiazole in a polymethyl methacrylate based plastic scintillator", Russian Journal of Applied Chemistry 76(10), p. 1655-1658 (Year: 2003).*

2-(4-tert-butylphenyl)-5-(4-biphenylyl)-1,3,4-oxadiazole Sigma-Aldrich Product Page [retrieved from https://www.sigmaaldrich.com/-catalog/substance/24tertbutylphenyl54biphenylyl134oxadiazole354441508228711?lang=en&region=US&attrlist=OLED Device Performance on Jun. 26, 2018].*

Machine translation of WO2005/061654A1.*

Lewe, T. et al., "Synthesen und Eigenschaften neuer Tris(fluorphenyl)antimon- und -bismut-Verbindungen. Kristallstruktur von Tris(2,6-difluorphenyl)bismuth," Journal of Inorganic and General Chemistry, vol. 622, pp. 2009-2015 (8 pages) (German language w/ English abstract), May 8, 1996.

Rauf, M.A. et al., "Spectrophotometric Studies of Ternary Complexes of Lead and Bismuth with o-Phenanthroline and Eosin," Dyes and Pigments, vol. 52, No. 3, pp. 183-189 (7 pages), Dec. 3, 2001.

Omary, Mohammad A. et al., "Enhancement of the Phosphorescence of Organic Luminophores Upon Interaction with a Mercury Trifunctional Lewis Acid," Inorganic Chemistry, vol. 42, pp. 2176-2178 (3 pages), Jan. 21, 2003.

Bolton, Onas et al., "Activating Efficient Phosphorescence from Purely Organic Materials by Crystal Design," Nature Chemistry, vol. 3, pp. 205-210 (7 pages), Feb. 13, 2011.

Liu, Zhiwei et al., "A Codeposition Route to CuI-Pyridine Coordination Complexes for Organic Light-Emitting Diodes," Journal of the American Chemical Society, vol. 133, No. 11, pp. 3700-3703 (4 pages), Mar. 2, 2011.

Brouwer, Albert M., "Standards for Photoluminescence Quantum Yield Measurements in Solution (IUPAC Technical Report)," Pure Appl. Chemistry, vol. 83, No. 12, pp. 2213-2228 (16 pages), Aug. 31, 2011.

German Office Action, Application No. 102013215342.2, 5 pages, dated Nov. 6, 2013.

International Search Report and Written Opinion, Application No. PCT/EP2014/059463, 23 pages, dated Jul. 21, 2014.

* cited by examiner

PRODUCTION OF ORGANIC PHOSPHORESCENT LAYERS WITH ADDITION OF HEAVY MAIN GROUP METAL COMPLEXES

CROSS-REFERENCE TO RELATED APPLICATIONS

This application is a U.S. National Stage Application of International Application No. PCT/EP2014/059463 filed May 8, 2014, which designates the United States of America, and claims priority to DE Application No. 10 2013 215 342.2 filed Aug. 5, 2013, the contents of which are hereby incorporated by reference in their entirety.

TECHNICAL FIELD

The present invention relates to a process for producing organic electronic layers including organic emitters that are phosphorescent at room temperature, wherein organic fluorescent emitters F are codeposited together with metal complexes containing organic complex ligands L and at least one heavy main group metal M selected from the group comprising In, Tl, Sn, Pb, Sb and Bi within one layer and the heavy main group metal M alters its coordination sphere with incorporation of the organic fluorescent emitter F.

BACKGROUND

Methods in principle for conversion of light to electrical current (and vice versa) by means of organic electronics have been known for several decades. An industrial breakthrough has been accomplished by multilayer constructions which are currently on the point of readiness for the mass market, as shown schematically, for example, in figure I for an organic light-emitting diode (OLED) or in figure II for an organic solar cell. Even though the efficiency of these components in the last few years in particular has undergone a distinct rise in performance through the use of optimized classes of organic compounds, promising approaches are still resulting in even higher quantum yields and hence even higher efficiencies with lower material costs.

One of these approaches lies in the use of phosphorescent emitters, called triplet emitters, which find use, for example, in PHOLEDs (phosphorescent organic light-emitting devices). In view of the applicable quantum statistics, these are at least theoretically capable of achieving an internal quantum efficiency of 100%. This contrasts with diodes having purely fluorescent emitters which, on the basis of the quantum statistics of the injected charge carriers, have a maximum internal quantum yield of only 25%.

Considering the internal quantum yield alone, organic electronic components which utilize a phosphorescence-based conversion of current to light (and vice versa) (triplet emitter/emission) are thus more suitable for providing a high luminescence ($cd/m^2$) or efficiency (cd/A, lm/W). Within the field of compounds capable of triplet emission, however, several boundary conditions have to be observed. Although phosphorescence also occurs in compounds of the elements of the fourth and fifth periods of the Periodic Table, it is the complexes of the metals of the 6th period that have become established in the abovementioned applications. According to the position of the elements in this period, the origin of the phosphorescence is weighted differently within the orbital structure of the complexes.

In the case of the lanthanoids, both the HOMO (Highest Occupied Molecular Orbital) and the LUMO (Lowest Unoccupied Molecular Orbital) are predominantly metal-centered, meaning that the proportion of the ligand orbitals is relatively minor. The effect of this is that the emission wavelength (color) of the emitters is determined almost exclusively by the band structure of the metal (examples: europium=red, terbium=green). Because of the strong shielding of the f electrons of these metals, ligands coupled to the metal are able to split the energies of the $f^n$ configuration of the metals only by about 100 $cm^{-1}$, such that there is a considerable difference in the spectroscopy, by virtue of their ligand field, of the d ions from that of the f ions. In the case of ions of the lanthanides, the color results from transitions from f to unoccupied s, p and d orbitals.

Going along the period to the elements of osmium, iridium, platinum and gold, ligand fields split the metal orbitals by a factor of 10-100 times more than in the case of the lanthanoids. It is thus possible to represent virtually the entire wavelength spectrum by varying the ligands with these elements. The strong coupling of the spin angular momentum of the metal atom with the spin angular momentum of the electrons results in phosphorescence being obtained in the emitters. The HOMO is usually metal-centered, while the LUMO is usually ligand-centered. The radiative transitions are therefore referred to as metal-ligand charge transfer transitions (MLCT).

Both OLEDs and OLEECs (light-emitting organic electrochemical cells) currently utilize almost exclusively iridium complexes as emitters. In the case of the OLEDs, the emitter complexes are uncharged; in the case of the OLEECs, ionic, i.e. charged, emitter complexes are utilized. However, the use of iridium in these components has a serious disadvantage. The annual production of iridium is well below 10 t (3 t in 2000). The effect of this is that the material costs make a significant contribution to the production costs of organic electrical components. An additional factor is that iridium emitters are incapable of efficiently representing the entire spectrum of visible light. For example, stable blue iridium emitters are comparatively rare, which is a barrier to flexible use of these materials in OLEDs or OLEECs.

In the recent literature, however, there are some approaches which propose "triplet harvesting" even with non-iridium-based emitters. For example, Omary et al. in "Enhancement of the Phosphorescence of Organic Luminophores upon interaction with a Mercury Trifunctional Lewis Acid" (Mohammad A. Omary, Refaie M. Kassab, Mason R. Haneline, O. Elbjeirami, and Francois P. Gabbai, Inorg. Chem. 2003, 42, 2176-2178) point out the possibility of achieving adequate phosphorescence of purely organic emitters through the use of mercury. As a result of the heavy atom effect of mercury in a matrix composed of organic ligands, a singlet-triplet/triplet-singlet transition of the excited electrons in the organic matrix is enabled by quantum-mechanical means (ISC, intersystem crossing), which results in a distinct reduction in the lifetime of the excited electronic (triplet) states and prevents unwanted saturation of the population of these states. The cause of this mechanism is the spin-orbit coupling of the heavy mercury atom with the excited electrons of the organic matrix. A disadvantage, however, is that the use of mercury is problematic for reasons of toxicology and environmental policy.

One means of obtaining an adequate quantum yield on the basis of purely organic phosphorescence emitters is described, for example, by Bolton et al. in NATURE CHEMISTRY, 2011, 1-6 ("Activating efficient phosphorescence from purely organic materials by crystal design", Onas Bolton, Kangwon Lee, Hyong-Jun Kim, Kevin Y. Lin and Jinsang Kim, NATURE CHEMISTRY, 2011, 1-6). This article suggests that the incorporation of heavy halides into a crystal composed of an organic matrix leads to high quantum yields through phosphorescent organic emitters. However, a disadvantage of this solution is that a particular distance between the heavy halides and the organic matrix and a crystalline structure seem to be necessary for this effect. This would be a barrier to inexpensive industrial manufacture of organic components.

WO 2012/016074 A1, by contrast, describes a thin layer comprising a compound of the formula

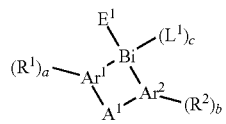

where $Ar^1$ and $Ar^2$ are each independently a C3-C30 aromatic ring; $R^1$ and $R^2$ are a substituent; a and b are each independently an integer from 0 to 12, where, when a is 2 or more, each $R^1$ radical is optionally different from the others, and two $R^1$ radicals are optionally bonded to one another to form a ring structure, and, when b is 2 or more, each $R^2$ radical is optionally different from the others, and two $R^2$ radicals are optionally bonded to one another to form a ring structure; $A^1$ is any kind of direct bond, —O—, —S—, —S(=O)—, —S(=O)$_2$—, —PR$^3$—, —NR$^4$— and —C(R$^5$)$_2$—; $R^3$ is a hydrogen atom or a substituent; $R^4$ is a hydrogen atom or a substituent; $R^5$ is a hydrogen atom or a substituent and two $R^5$ radicals are optionally different from one another; $E^1$ is a monovalent radical having 50 or fewer carbon atoms; $L^1$ is a ligand having 50 or fewer carbon atoms; c is an integer from 0 to 3, where, when c is 2 or more, each $L^1$ radical is optionally different from the others; and every combination of a combination of $E^1$ and $Ar^1$ and a combination of $E^1$ and $Ar^2$ optionally forms a bond; and, when c is 1 to 3, every combination of a combination of $L^1$ and $E^1$, a combination of $L^1$ and $Ar^1$, a combination of $L^1$ and $Ar^2$ and a combination of $L^1$ and $L^1$ optionally forms a bond. A disadvantage, however, is that the compounds described have only an inadequate quantum yield and are insufficiently stable in solution, such that they decompose.

DE 103 60 681 A1 discloses main group metal diketonato complexes according to the following formula:

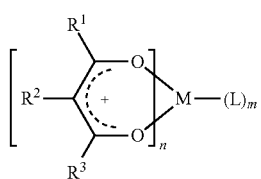

as phosphorescent emitter molecules in organic light-emitting diodes (OLEDs) in which M may be Tl(I), Pb(II) and Bi(III). Additionally disclosed is the use of these main group metal diketonato complexes as light-emitting layers in OLEDs, light-emitting layers comprising at least one main group metal diketonato complex, an OLED comprising this light-emitting layer, and devices comprising an OLED of the invention. In experiments, however, it was shown that the abovementioned compounds synthesized with strict exclusion of water do not exhibit phosphorescence-based emission after electronic excitation. It is highly likely that the phosphorescent emissions cited originate from indeterminate oxo clusters which have formed in an uncontrolled manner, for example as a result of hydrolysis in the course of preparation. A disadvantage of this specific solution is that the π system of these acetylacetonate ligands, especially of the fully fluorinated variants described, is not very well-developed and, as a sole phosphorescent emitter, allows only small phosphorescence yields.

SUMMARY

One embodiment provides a process for producing organic electronic layers including organic emitters that are phosphorescent at room temperature, wherein organic fluorescent emitters F are codeposited together with metal complexes containing organic complex ligands L and at least one heavy main group metal M selected from the group comprising In, Tl, Sn, Pb, Sb and Bi within one layer and the heavy main group metal M alters its coordination sphere with incorporation of the organic fluorescent emitter F.

In a further embodiment, the heavy main group metal comprises Bi.

In a further embodiment, the proportion of phosphorescent emission caused by electronic inter- and intra-ligand transfers with purely electronic excitation is not less than 20% and not more than 100%.

In a further embodiment, the organic fluorescent emitters F are selected from the group of the substituted or unsubstituted C6-C60 aromatics or heteroaromatics.

In a further embodiment, the organic fluorescent emitter F is 4,7-di (9H-carbazol-9-yl)-1,10-phenanthroline (BUPH1).

In a further embodiment, the ligands L of the metal complex are independently selected from the group comprising halides and fluorinated or nonfluorinated C2-C20 alkyl or aryl carboxylates, alkoxides, thiolates, cyanates, isocyanates, thiocyanates, acetylacetonates, sulfonates.

In a further embodiment, the metal complex comprises one or more compounds from the group of Bi(III) fluorobenzoate, Bi(III) fluoroalkyl-benzoate, Bi(III) fluorodialkylbenzoate, Bi(III) fluorotri-alkylbenzoate, Bi(III) pentafluorobenzoate and Bi(III) 3,5-trifluoromethylbenzoate.

In a further embodiment, the metal complex comprises one or more compounds from the group of the triarylbismuth (V) carboxylates.

In a further embodiment, the metal complex is selected from the group comprising Bi(III) triscarboxylate, Bi(III) fluoroacetate and Bi(III) trifluoroacetate.

In a further embodiment, the metal complex and the organic fluorescent emitter F are deposited on a carrier substrate by means of coevaporation, rotary or curtain coating, bar coating or printing.

In a further embodiment, the molar ratio of metal complex to organic fluorescent emitter F is not less than 1:10 and not more than 10:1.

In a further embodiment, the deposition of the metal complex and the organic fluorescent emitter F is effected by means of a coevaporation method and the deposition rate of the organic electronic layer is not less than 0.1 Å/s and not more than 200 Å/s.

Another embodiment provides a layer in an organic electronic component produced by any of the processes disclosed above.

Another embodiment provides a use of a layer as disclosed above as an active layer in an organic electronic component for conversion of electrical current to light, of light to electrical current and of light to light of another wavelength.

Another embodiment provides an organic semiconductor component selected from the group comprising photodiodes, solar cells, organic light-emitting diodes, light-emitting electrochemical cells comprising a layer as disclosed above.

BRIEF DESCRIPTION OF THE DRAWINGS

Example embodiments of the invention are discussed in detail below with reference to the drawings, in which.

DETAILED DESCRIPTION

Figure 1:
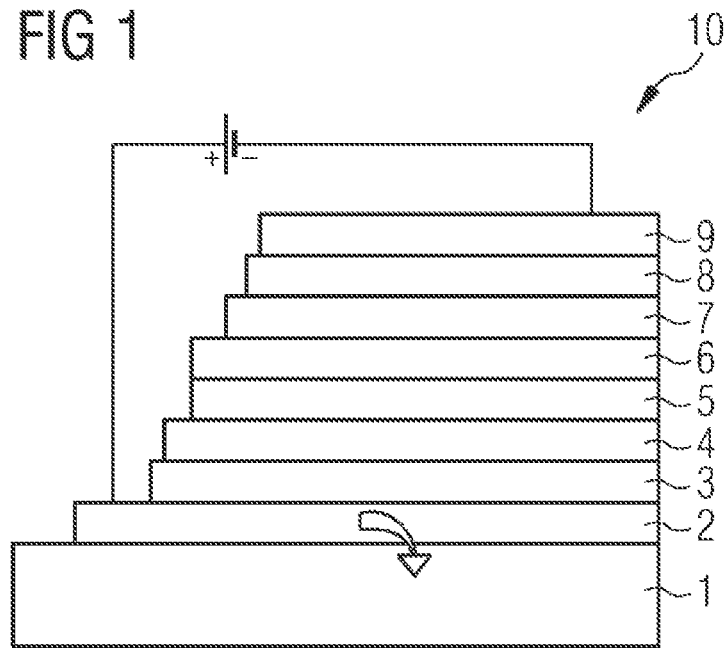
FIG. 1 shows a schematic of the structure of an organic light-emitting diode 10. The light-emitting diode is constructed from a glass layer 1; indium tin oxide ITO layer 2; hole injector layer 3; hole transport layer HTL 4; emitter layer EML 5; hole blocker layer HBL 6; electron transport layer ETL 7; electron injector layer 8 and a cathode layer 9.
Figure 2:
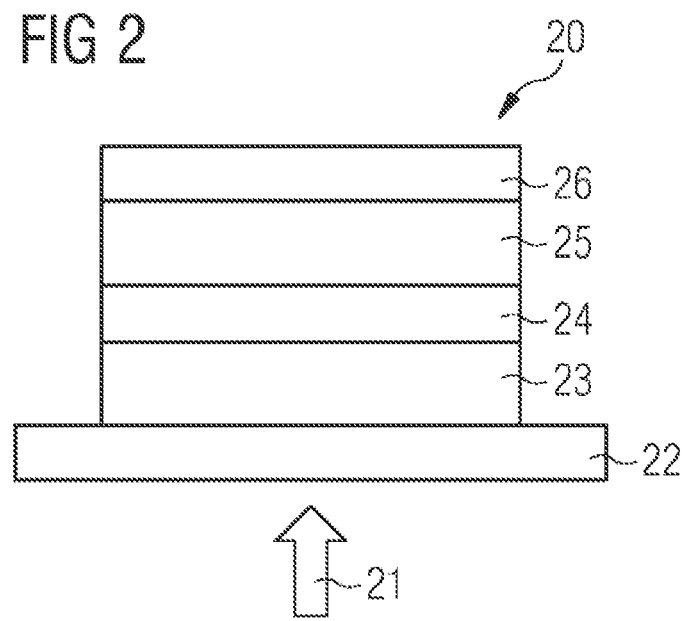
FIG. 2 shows a schematic of the structure of an organic solar cell having PIN structure 20 which converts light 21 to electrical current. The solar cell consists of a layer of indium tin oxide 22; a p-doped layer 23; an absorption layer 24; an n-doped layer 25 and a metal layer 26.

Embodiments of the present invention provide a process by which it is possible to inexpensively produce layers for organic electronic components which enable effective conversion of current to light and vice versa through the utilization of phosphorescence.

Some embodiments provide a process for producing organic electronic layers including organic emitters that are phosphorescent at room temperature, wherein organic fluorescent emitters F are codeposited together with metal complexes containing organic complex ligands L and at least one heavy main group metal M selected from the group comprising In, Tl, Sn, Pb, Sb and Bi within one layer and the heavy main group metal M alters its coordination sphere with incorporation of the organic fluorescent emitter F. It has been found that, surprisingly, by means of this process, it is possible in a simple and inexpensive manner to obtain layers having emitters that are phosphorescent at room temperature, which have a high internal quantum efficiency, high luminances, rapid response characteristics and good long-term stabilities. Because of the fact that the phosphorescence is caused only by the organic emitters, by modification of the ligands, especially the π system thereof, it is additionally possible to tune the emission wavelength of the emitters. It is especially possible to construct heteroleptic complexes or addition compounds which enable emissions via the orbitals of ligands/emitters of different structure. This additionally increases the variety for preparation of purely organic phosphorescent emitters. Without being bound by the theory, within the process of the invention, the organic emitter capable of fluorescence is deposited close to the heavy main group metal, with a change in the coordination sphere of the metal. The change in the coordination sphere of the metal may consist in an increase in the number of coordinated ligands/emitters, in a replacement of one or more ligands by emitters, or even in the reduction in the number of coordinated ligands as a result of the adduct/addition/complex formation with the emitter. This is a function of the steric and electronic requirements of the emitters and ligands, the coordination strength of the individual ligands and the deposition rate and temperature in the context of the production chosen. In the case of adduct formation or coordination of the emitter to the heavy main group metal atom, there is no need for a σ bond to be formed between the heavy atom and the organic emitters. Weak electrostatic and/or π interactions between metal and emitter are sufficient. However, the interaction with the heavy metal atom can also result in alteration in the energy level of the HOMO/LUMO of the fluorescent emitter(s). As a result of the heavy atom effect, there may additionally be spin-orbit coupling between the emitter electrons and the nucleus of the metal atom, the effect of which is that hitherto spin-forbidden electronic transitions are allowed by quantum-mechanical means. This lowers the lifetime of the electronically excited states and hence opens up an effective phosphorescence channel (with triplet-singlet transitions) at room temperature. The metal does not become directly involved in the emission; it merely provides its spin angular momentum. This contrasts with the emission of the organic emitters without heavy metal coordination, which is purely fluorescent at room temperature.

The emitter layers obtained in accordance with the invention may be neutral or ionic in nature and may thus exhibit emission characteristics typical of OLEDs or OLECs.

An organic electronic layer in the context of the invention is understood to mean a layer comprising organic emitters, metal complexes containing heavy main group metals and optionally matrix materials. The layer may also be amorphous, meaning that the individual constituents in this layer do not have any periodic arrangement over any great range (long-range order). More particularly, this is not understood to mean the presence of a single-crystal or crystalline regions having an extent of not less than 50 nm. The compounds present in the layer, however, may have a certain short-range order (distance and orientation) with respect to their closest neighbors. But these areas are randomly distributed. Within an x-ray diffractogram, obtained, for example, by an XRD measurement (x-ray powder diffractometry), the amorphous layer features a broad halo. It has been found that, surprisingly, an amorphous arrangement of the regions in the layer is sufficient to obtain an adequate phosphorescence yield. This contrasts with experimental results which call for a very regular arrangement of a multitude of metal atoms and emitters as a condition for the obtaining of high phosphorescence yields.

As a result of the influence of the heavy metal, a significant phosphorescence contribution of the organic fluorescent emitter is obtained at room temperature. Room temperature in the context of the invention is the temperature range from −50° C. to 150° C. (the standard operating temperature range for organic electronics). Within this temperature range, the phosphorescent transitions of one or more fluorescent emitters lacking influence from heavy metal atoms generally do not make any significant contributions to the emission of purely organic emitters.

Organic fluorescent emitters F are organic molecules which can have either partial or overall aromatic character with delocalized π electrons. In addition, these molecules may have heteroatoms such as N, N—R, O, S, Se, Si or metals such as Li or Al, Ga or Zn. R in this case is an alkyl or aromatic radical. These molecules, in solid form or in solution, after electronic excitation, exhibit fluorescence, i.e. electronic (S1-S0) singlet-singlet transitions. Phosphorescent transitions (T-S) cannot be observed at room temperature because of the quantum-mechanical exclusion rules (reversal of spin). The lifetime of the fluorescent transitions in the organic fluorescent emitters usable in accordance with the invention can be within a range below 100 ns without the proximity of the heavy metal atom.

Preferably, the organic fluorescent emitters F may be $C_1$-$C_{60}$ heteroaromatics, further preferably $C_{15}$-$C_{50}$ heteroaromatics. In specific applications, the oxygen- and nitrogen-containing heteroaromatics have been found to be particularly favorable. In addition, organic fluorescent emitters which can be used with preference within the process of the invention are those having a triplet state separated from the S0 state by not less than −5 eV and not more than 5 eV. With these electronic boundary conditions, it is possible to obtain particularly high quantum yields in the context of the process of the invention.

In the context of the process of the invention, metal complexes containing heavy main group metals M from the group comprising In, Tl, Sn, Pb, Sb and Bi are used. These metal complexes may include organic complex ligands and are preferred particularly because of their availability, their procurement cost and their ability to develop marked spin-orbit coupling and the possibility of extending the coordination sphere. It is also possible for a plurality of different metals from the abovementioned group to be present in the metal complex usable in accordance with the invention. This group is particularly suitable, since the elements listed therein have a particularly high spin angular momentum which enables effective phosphorescence transitions in the organic emitters F. Moreover, these metals are available in high purity at relatively low cost.

In a particular embodiment, the group may advantageously also include Sn, Pb and Bi. These metals additionally have the benefit of having very good processibility from solutions as well.

Preferably, the metals can be coordinated to organic ligands having terminal, bidentate, tridentate or heterobimetallic bridging to the metal atom. Advantageous configurations can arise when the coordination of the ligands to the metal atom is via two oxygen atoms. Without being bound by the theory, these substituents, in the course of the deposition process, can be efficiently displaced by the organic emitters or the coordination sphere can be extended, and hence contribute to a high phosphorescence yield. In addition, by means of these substituents, the emission wavelength of the phosphorescent light can be adjusted by ligand-ligand transitions. Preferably, ligands coordinated in this way may have aromatic π systems having at least 10 carbon atoms. This can contribute to a major broadening of the emission wavelengths in the case of ligand-ligand transitions.

The heavy main group metal M alters its coordination sphere with incorporation of the organic fluorescent emitter F. Without being bound by the theory, in the process of the invention, the organic emitter is brought close to the main group metal. There is then a change in the arrangement of the ligands of the metal complex. This is caused by van der Waals, coulombic, π-σ or σ interactions of the organic emitter with the metal. A σ interaction is not needed for development of phosphorescence, but may also be formed. The coordination sphere of the metal can be broadened by the proximity of the organic emitter. There may also be substitution of an individual ligand or of several ligands by the organic emitter. In addition, it is also possible that the number of ligands is reduced by the change in the coordination sphere. This results, for example, from the displacement of one or more ligands by the incorporation of the fluorescent organic emitter.

In addition to the metal complex and to the organic emitter, it is possible in the context of the process of the invention for further noncoordinating matrix materials to be deposited within the layer. This/these matrix material(s) may, for example, affect the electronic conductivity of the layer or generally affect the mobility of the organic emitter or the metal complex. Suitable matrix materials may be selected from the group of 2,2',7,7'-tetrakis(carbazol-9-yl)-9,9-spirobifluorene; 2,7-bis(carbazol-9-yl)-9,9-ditolylfluorene; 9,9-bis[4-(carbazol-9-yl)phenyl]-fluorene; 2,7-bis(carbazol-9-yl)-9,9-spirobifluorene; 1,4-bis-(triphenylsilyl) benzene; 1,3-bis(triphenylsilyl)benzene; bis(4-N,N-diethylamino-2-methylphenyl)-4-methylphenylmethane; 2,7-bis(carbazol-9-yl)-9,9-dioctylfluorene; 4,4''-di(triphenyl-silyl)-p-terphenyl; 4,4'-di(triphenylsilyl)biphenyl; 9-(4-tert-butylphenyl)-3, 6-bis(triphenylsilyl)-9H-carbazole; 9-(4-tert-butylphenyl)-3, 6-ditrityl-9H-carbazole; 9-(4-tert-butylphenyl)-3,6-bis(9-(4-methoxyphenyl)-9H-fluoren-9-yl)-9H-carbazole; 2,6-bis(3-(9H-carbazol-9-yl)phenyl) pyridine; 3,5-bis(3-(9H-carbazol-9-yl)phenyl)pyridine, triphenyl(4-(9-phenyl-9H-fluoren-9-yl)phenyl)silane; 9,9-dimethyl-N,N-diphenyl-7-(4-(1-phenyl-1H-benzo[d]imidazol-2-yl)phenyl)-9H-fluoren-2-amine; 3,5-bis(3-(9H-carbazol-9-yl)phenyl)pyridine; 9,9-spirobi-fluoren-2-yldiphenylphosphine oxide; 9, 9'-(5-(triphenylsilyl)-1,3-phenylene)bis(9H-carbazole); 4,4,8,8,-12,12-hexa-p-tolyl-4H-8H-12H-12C-azadibenzo[cd,mn]pyrene; 2,2'-bis(4-(carbazol-9-yl)phenyl)biphenyl; 2,8-bis (diphenylphosphoryl)dibenzo[b,d]-thiophene; bis(2-methylphenyl)diphenylsilane; bis[3,5-di(9H-carbazol-9-yl) phenyl]diphenylsilane; 3,6-bis(carbazol-9-yl)-9-(2-ethylhexyl)-9H-carbazole; 3-(diphenylphosphoryl)-9-(4-(diphenylphosphoryl)phenyl)-9H-carbazole; 3,6-bis[(3,5-diphenyl)phenyl]-9-phenylcarbazole; 2,8-di(9H-carbazol-9-yl)-dibenzo[b,d]thiophene; 10-(4'-(diphenylamino) biphenyl-4-yl)-acridin-9(10H)-one; 2,7-bis (diphenylphosphoryl)-9,9'-spiro-bi[fluorene]; 1,4-bis((9H-carbazol-9-yl)methyl)benzene; bis-4-(N-carbazolyl)phenyl) phenylphosphine oxide; 2,7-bis-(diphenylphosphoryl)-9-(4-diphenylamino)phenyl-9'-phenyl-fluorene; di(4-(6H-indolo [3,2-b]quinoxalin-6-yl)phenyl)-diphenylsilane; di(4-(6H-indolo[3,2-b]quinoxalin-6-yl)phenyl)-diphenylmethane; bis [3,5-di(9H-carbazol-9-yl)phenyl]diphenylsilane; 2,6,14-tris (carbazol-9-yl)triptycene; 2,6,14-tris(diphenylphosphine oxide)triptycene; 2,6,14-tris(diphenylamino)triptycene; 2,7-bis(diphenylphosphoryl)-9-phenyl-9H-carbazole; tris[4-(9-phenylfluoren-9-yl)phenyl]aminobiphenyl-3-amine); 2,7-bis-(diphenylphosphoryl)spiro[fluorene-7,11'-benzofluorene].

In one embodiment of the process, the heavy main group metal may comprise Bi. Bismuth has been found to be particularly suitable because of its economic and process technology properties. There exists a multitude of complexes which can be processed particularly efficiently with organic fluorescent emitters in the context of wet or gas phase processes. Even though bismuth follows directly after lead in the Periodic Table, it has quite different physiological properties. As a result of the fact that it can be absorbed only with difficulty via the gastrointestinal tract, bismuth poisoning is comparatively rare. On the contrary, salts of bismuth are used in medicine for treatment of stomach ulcers or syphilis. It has also been used as a contrast agent for x-ray examinations. The only naturally occurring isotope of bismuth is that of mass 209. It is a radioactive a emitter with a half-life of $1.9 \times 10^{19}$ years. The long half-life results in an activity of 0.0033 Bq for 1 kg. This is therefore about 10 million times less than that of the potassium which occurs in organisms. 1 kg of potassium by nature contains 0.012%, i.e. 0.12 g, of the radioactive isotope $^{40}K$ having a half-life $t_{1/2}$ of $1.248 \times 10^9$ years=$39.38 \times 10^{15}$ seconds, and has an atomic mass of 39.96. This results in a radioactivity of 31 825 Bq. Thus, the radioactivity of bismuth for practical applications is negligibly small and would not even be detectable by a human holding a Geiger counter. Bismuth, in contrast to iridium (3/2) and europium (5/2), has a nuclear spin of (9/2). This is capable of coupling with unpaired electrons present on ligands (see also "Synthesen und Eigenschaften neuer Tris(fluorphenyl)antimon- und -bismut-Verbindungen. Kristallstruktur von Tkis(2,6-difluorphenyl)bismuth" [Synthesis and Properties of Novel Tris(fluorophenyl)antimony and -bismuth Compounds. Crystal structure of Tkis(2,6-difluorophenyl)-bismuth] by T. Lewe et al., Z. anorg. allg. Chem. 622 (1996) 2009-2015). These properties and the fact that bismuth deposits, in contrast to iridium deposits, are subject to virtually no restriction may lead to a dramatically better reactant cost situation.

Preferably, the bismuth complexes usable may include bismuth in oxidation number of +II, +III or +V. These oxidation numbers have been found to be particularly suitable as an addition point for still further ligands, for example the organic emitter F. The addition kinetics of the organic emitters with these oxidation numbers of bismuth seem to be particularly suitable specifically for a gas phase deposition as well. In addition, the bismuth II/III/V complexes can be formed to layers very efficiently by means of gas phase deposition or else wet processes on the basis of their physical data, for example the evaporation temperature or solubility.

More particularly, the coordination sphere of the Bi metal atom can be altered by an addition of heteroatoms of a fluorescent emitter. This may result in addition compounds in which specific metal-heteroatom distances have been found to be particularly advantageous. In the case of fluorescent emitters which can interact with the Bi heavy metal atom via an oxygen, a preparation which has been found to be particularly suitable is one in which the Bi—O distance is not less than 2.25 Å and less than 2.75 Å, preferably not less than 2.3 Å and less than 2.70 Å and further preferably not less than 2.4 Å and less than 2.6 Å.

In the case of interaction via a Cl heteroatom, a preparation which has been found to be particularly suitable is one in which the Bi—Cl distance is not less than 2.3 Å and less than 2.9 Å, preferably not less than 2.4 Å and less than 2.80 Å and further preferably not less than 2.45 Å and less than 2.75 Å.

In the case of interaction via an N heteroatom, a preparation which has been found to be particularly suitable is one in which the Bi—N distance is not less than 2.3 Å and less than 2.9 Å, preferably not less than 2.4 Å and less than 2.80 Å and further preferably not less than 2.45 Å and less than 2.70 Å.

In the case of interaction via an I heteroatom, a preparation which has been found to be particularly suitable is one in which the Bi—I distance is not less than 2.6 Å and less than 3.2 Å, preferably not less than 2.7 Å and less than 3.10 Å and further preferably not less than 2.8 Å and less than 3.1 Å.

In the case of interaction via a Br heteroatom, a preparation which has been found to be particularly suitable is one in which the Bi—Br distance is not less than 2.5 Å and less than 3.1 Å, preferably not less than 2.6 Å and less than 3.0 Å and further preferably not less than 2.7 Å and less than 2.95 Å.

The bond lengths may be determined from single-crystal data of the compounds in question by methods known to those skilled in the art.

These distances of the heteroatom-containing emitters from the heavy metal atom show a sufficient heavy metal atom effect to open up the fluorescence channel in the organic emitter and additionally enable good interaction of the organic emitter with the remaining ligands.

In a further configuration of the process, the proportion of phosphorescent emission caused by electronic inter- and intra-ligand transitions with purely electronic excitation may be not less than 20% and not more than 100%. The incorporation of the fluorescent emitter into the coordination sphere of the heavy metal atom may open up an effective "phosphorescence channel" of the organic emitter. In addition to fluorescent emission, additional contributions can also be obtained through phosphorescent radiation. This can contribute to a distinct increase in the internal quantum yield of the layer. The distinction of whether a radiation component is of fluorescent or phosphorescent origin can be determined on the basis of time-correlated single photon counting (TCSPC measurements). By means of TCSPC, the lifespan of every single photon is measured and the distribution of the lifespans is accumulated. Components on a microsecond timescale can be attributed here to phosphorescent transitions, and faster transitions to fluorescent transitions. What is considered in each case is the mathematical fit to the intensity curve measured. This method is known to those skilled in the art. Examples thereof can be found in the experimental section.

In an additional configuration of the process, the organic fluorescent emitters F may be selected from the group of the substituted or unsubstituted C6-C60 aromatics or heteroaromatics. To obtain a maximum phosphorescence contribution of the organic fluorescent emitter and a very stable association of the emitter with the heavy main group metal, it is particularly advantageously possible to use fluorescent emitters within this size range. In addition, it is possible to deposit these emitters efficiently either from the liquid phase or from the gas phase. The individual molecules may either have full aromatic through-conjugation or have some non-aromatic sections.

In an alternative configuration of the process, the longest lifetime of electronically excited states of the organic fluorescent emitter F after incorporation into the coordination sphere of the heavy main group metal M at room temperature may be not less than 0.01 microsecond and not more than 10 000 microseconds. The incorporation of the organic fluorescent emitter F into the coordination sphere of the heavy main group metal M may, as a result of the spin-orbit coupling of the metal with the excited electrons of the organic emitter, enable intercombination of the singlet states with the triplet states. These can "open up" the phosphorescence channel of the emitter, which can lead to a higher quantum yield and longer observable lifetimes of the excited electronic states of the emitter. The lifetimes can be determined by standard methods, as conducted, for example, in the examples by means of TCSPC. The fluorescent transitions feature lifetimes of $10^{-9}$-$10^{-7}$ seconds, whereas the phosphorescent transitions typically have longer time constants. Depending on the composition of the electrical layer, it is also possible for several time constants or lifetimes to be present. The longest lifetime in the sense of the invention is that which has the greatest lifetime with a proportion of the total lifetime of not less than 2.5%.

In a further configuration of the process, the organic fluorescent emitters F may be selected from the group comprising 4,7-di(9H-carbazol-9-yl)-1,10-phenanthroline, 2,6-bis(3-(9H-carbazol-9-yl)phenyl)pyridine, 3,5-bis(3-(9H-carbazol-9-yl)phenyl)pyridine, 2,8-di(9H-carbazol-9-yl)-dibenzo[b,d]thiophene, 2,2',2"-(1,3,5-benzenetriyl)tris (1-phenyl-1H-benzimidazole), 2-(4-biphenylyl)-5-(4-tert-butylphenyl)-1,3,4-oxadiazole, 2,9-dimethyl-4,7-diphenyl-1,10-phenanthroline, 8-hydroxyquinolinolatolithium, 4-(naphthalen-1-yl)-3,5-diphenyl-4H-1,2,4-triazole, 1,3-bis [2-(2,2'-bipyridin-6-yl)-1,3,4-oxadiazo-5-yl]benzene, 4,7-diphenyl-1,10-phenanthroline, 3-(4-biphenylyl)-4-phenyl-5-tert-butylphenyl-1,2,4-triazole, bis(2-methyl-8-quinolinolato)-4-(phenyl-phenolato)aluminum, 6,6'-bis[5-(biphenyl-4-yl)-1,3,4-oxadiazol-2-yl]-2,2'-bipyridyl, 2-phenyl-9,10-di(naphthalen-2-yl)-anthracene, 2,7-bis[2-(2, 2'-bipyridin-6-yl)-1,3,4-oxadiazol-5-yl]-9,9-dimethylfluorene, 1,3-bis[2-(4-tert-butylphenyl)-1,3,4-oxadiazol-5-yl] benzene, 2-(naphthalen-2-yl)-4,7-diphenyl-1,10-phenanthroline, 2,9-bis(naphthalen-2-yl)-4,7-diphenyl-1, 10-phenanthroline, tris(2,4,6-trimethyl-3-(pyridin-3-yl) phenyl)borane, 1-methyl-2-(4-(naphthalen-2-yl)-phenyl)-1H-imidazo[4,5-f][1,10]phenanthroline, 1,3-bis-(carbazol-9-yl)benzene, 1,3-bis(carbazol-9-yl)pyridine, 1,3,5-tris (carbazol-9-yl)benzene, 9-(3-(9H-carbazol-9-yl)phenyl)-3-(4-(1-phenyl-1H-benzo[d]imidazol-2-yl)phenyl)-9H-carbazole, 2,6,14-tris(carbazol-9-yl)triptycene, 1,3-bis (carbazol-9-yl)-benzene, 1,3,5-tris(carbazol-9-yl)benzene, 3,5-di(9H-carbazol-9-yl)biphenyl, 9-(3,5-bis(diphenylphosphoryl)phenyl)-9H-carbazole, bis[3,5-di(9H-carbazol-9-yl) phenyl]diphenylsilane, 2,8-bis(diphenylphosphoryl)dibenzo [b,d]thiophene, poly[3-(carbazol-9-yl)-9-(3-methyloxetan-3-ylmethyl)carbazole], poly[3-(carbazol-9-ylmethyl)-3-methyloxetane]. These compounds have been found, but without restriction, to be particularly suitable for use as organic fluorescent emitters F. Both the electronic and steric properties of these compounds allow sufficient interactions with the heavy main group metals to "open up" the phosphorescence channel with good internal quantum yields and long lifetime of the layers. In addition, these compounds have sufficiently large aromatic regions which can lead to suitable emission wavelengths. The good interaction of the organic fluorescent emitters F can very probably also be attributed to the steric features thereof and here especially to the suitable coordination sites to the metal atom.

In addition, these compounds have good processing in wet processes and also gas phase deposition processes.

In a further configuration of the process, the organic fluorescent emitter F may be 4,7-di(9H-carbazol-1-yl)-1,10-phenanthroline (BUPH1). BUPH1 shows, very probably because of its electronic HOMO/LUMO structure, only pure fluorescence emission at room temperature without coordination to a heavy main group metal from the above-specified group. After coordination or adduct formation with the main group metal, phosphorescent emissions are observable with high quantum yields. These are determined to a high degree by the electronic structure of the organic emitter and the remaining ligands of the complex. Layers having this emitter structure have been found to be particularly efficient and long-lived. The long life can probably be attributed to the size of the organic molecule and the low crystallization tendency thereof.

In a further configuration of the process, the ligands of the metal complex may independently be selected from the group comprising halides and fluorinated or nonfluorinated C2-C20 alkyl or aryl carboxylates, alkoxides, thiolates, cyanates, isocyanates, thiocyanates, acetylacetonates, sulfonates. These ligands in the metal complex may contribute to easy processability in wet processes and also gas phase processes, and because of their coordination properties to the metal atom to simple alteration of the coordination sphere of the metal atom. Within the metal complex, it is possible here for only one or else more than one of the abovementioned ligands to be present. Preferably, the complex may have mixed ligands, either via extension of the coordination sphere of the metal or via replacement of a single ligand or a plurality of ligands. These ligands may additionally be utilized for adjustment of the emission wavelength of the organic emitter. This can be caused by electronic interactions of the ligand(s) with the emitter. These ligands L in the metal complex may preferably make up a portion of not less than 0% and not more than 20% of the total emission yield of the layer. Preferably, this range may be between not less than 0% and not more than 10% and additionally preferably between not less than 0% and not more than 5%.

In addition, in a further aspect of the process, the ligands L of the metal complex may independently be selected from the group comprising C6-C30 aromatics and heteroaromatics.

These aromatics or heteroaromatics may contribute to easy processability in wet processes or else gas phase processes and additionally enable the organic emitters to have simple coordination to the metal atom. The interactions of the π electrons can additionally affect the position of the phosphorescence wavelengths of the organic emitter and thus contribute to an altered emission spectrum.

In a further embodiment, the metal complex may contain a Bi(III) and at least one complex ligand from the group of the unsubstituted, partly fluorinated or perfluorinated organic carboxylic acids. Preferably, the metal complex may contain one, two or three of these organic carboxylic acids. Organic carboxylic acids may generally be selected from the group of these aliphatic saturated monocarboxylic acids; aliphatic unsaturated monocarboxylic acids; aliphatic saturated dicarboxylic acids; aliphatic saturated tricarboxylic acids; aliphatic unsaturated dicarboxylic acids; aromatic carboxylic acids; heterocyclic carboxylic acids; aliphatic unsaturated cyclic monocarboxylic acids. Particularly preferred partially fluorinated or perfluorinated ligands L may be selected from substituted or unsubstituted compounds of acetic acid, phenylacetic acid and/or benzoic acid. More preferably, it is possible to use nonfluorinated, partly fluorinated or perfluorinated acetic acid. In a further preferred embodiment, one or more polydentate ligands L in the unevaporated state may be disposed between the metal atoms of the complex in a bridging manner. These compounds can be processed in a simple manner either from the wet phase or via a gas phase deposition process and enable good binding of the fluorescent emitter within the layer. In this way, they can lead to long-lived emitter components which have a very good quantum yield.

More preferably, the Bi(III) metal complexes as starting materials, according to structures specified below, may either have a mononuclear structure:

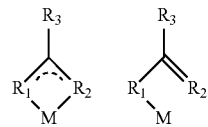

or, according to structures specified below, a dinuclear structure:

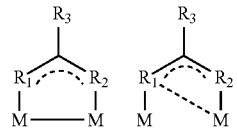

where $R^1$ and $R^2$ may each independently be oxygen, sulfur, selenium, NH or $NR^4$ where $R^4$ is selected from the group comprising alkyl or aryl and may be bonded to $R^3$; and $R^3$ is selected from the group comprising alkyl, long-chain alkyl, alkoxy, long-chain alkoxy, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, where, in the case of suitable radicals, one or more nonadjacent $CH_2$ groups may independently be replaced by —O—, —S—, —NH—, —NR°—, —SiR°R°°—, —CO—, —COO—, —OCO—, —OCO—O—, —$SO_2$—, —S—CO—, —CO—S—, —CY1=CY2 or —C≡C—, in such a way that no O and/or S atoms are bonded directly to one another, and likewise optionally by aryl or heteroaryl preferably containing 1 to 30 carbon atoms (terminal $CH_3$ groups are understood as $CH_2$ groups in the sense of $CH_2$—H).

Without being bound by the theory, there is terminal coordination of the metal via the ligand(s) in the case of the mononuclear complexes. In the case of a bidentate complex, there is di- or tridentate coordination of the metal atom. This coordination geometry can facilitate the access of a fluorescent emitter and thus contribute to effective complex or adduct formation. In addition, these compounds in layers exhibit good electrical properties and a low tendency to crystallization, and so high quantum yields may be obtainable in a long-lived system.

In a further characteristic feature of the process, the metal complex may comprise one or more compounds from the group of trisarylbismuth(III) biscarboxylate and Bi(III) triscarboxylate. Trisarylbismuth carboxylate is of the following formula:

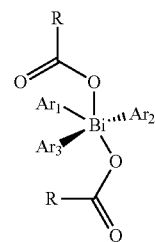

where $Ar_1$, $Ar_2$ and $Ar_3$ are independently substituted or unsubstituted, fluorinated or nonfluorinated aromatics or heteroaromatics. These compounds can be processed particularly easily by means of wet phase or gas phase deposition and enable good coordination of the organic fluorescent emitters to the central bismuth atom. The layers thus obtained feature a high quantum yield and a low tendency to crystallization.

This can increase the lifetime of the layers.

In addition, in a further aspect of the process, the metal complex may comprise one or more compounds from the group of partly or fully fluorinated triphenylbismuth(V) bis(fluoro-benzoate) and Bi(III) pentafluorobenzoate. These compounds can be processed particularly easily by means of wet phase or gas phase deposition and enable good coordination of the organic fluorescent emitters to the central bismuth atom. The layers thus obtained feature a high quantum yield and a low tendency to crystallization. This can increase the lifetime of the layers.

In an additional characteristic feature of the process, the metal complex may comprise one or more compounds from the group of Bi(III) fluorobenzoate, Bi(III) fluoroalkylbenzoate, Bi(III) fluorodialkylbenzoate, Bi(III) fluorotrialkylbenzoate, Bi(III) pentafluorobenzoate and Bi(III) 3,5-trifluoromethylbenzoate. These compounds having Bi in the III oxidation state and benzoate substituents can be processed particularly easily by means of wet phase or gas phase deposition and enable good coordination of the organic fluorescent emitters to the central bismuth atom. The layers thus obtained feature a high quantum yield and a low tendency to crystallization. This can increase the lifetime of the layers. The fluorination may cover either only one individual hydrogen atom or extend as far as perfluorination of the compound. The alkyl groups may preferably be C1-C5-alkyl and, if otherwise specified, 1-4 positions of the base structure may independently be alkylated.

In a further aspect of the process, the metal complex may comprise one or more compounds from the group of the trisarylbismuth(V) carboxylates. These compounds having Bi in the V oxidation state can be processed particularly easily by means of wet phase or gas phase deposition and enable good coordination of the organic fluorescent emitters to the central bismuth atom. The layers thus obtained feature a high quantum yield and a low tendency to crystallization. This can increase the lifetime of the layers. The fluorination may cover either only one individual hydrogen atom or extend as far as perfluorination of the compound. A preferred compound of this class of compounds is, for example, wholly or partly fluorinated triphenylbismuth(V) bis(fluorobenzoate).

In a further embodiment, the metal complex may be selected from the group comprising Bi(III) triscarboxylate, Bi(III) fluoroacetate and Bi(III) trifluoroacetate. Specifically the coordination of the ligands via two oxygen atoms to the heavy main group metal may enable easier alteration of the coordination sphere via the entry of the organic fluorescence emitter. By virtue of this configuration, it is possible to produce particularly stable and efficient layers having long lifetimes.

In an additional configuration of the process, the metal complex and the organic fluorescent emitter F may be deposited on a carrier substrate by means of coevaporation, rotary or curtain coating, bar coating or printing. More preferably, the amorphous layer may be produced by means of gas phase deposition or wet processes. By means of these processes, it is possible to deposit the metal complex and the organic fluorescence emitter together and thus to form the amorphous layer. Both substances can be sublimed from different sources using thermal energy in a coevaporation process. By means of these processes, particularly homogeneous and uniform layers are obtained. Solvent processes may preferably be conducted in such a way that the components are deposited onto a substrate from a solvent. This can simplify the process regime and enable less expensive production. In addition, still further materials, for example matrix materials which do not coordinate to the metal atom, may be dissolved in the solvent and/or deposited as well within the layer. It is likewise possible for these matrix materials to be additionally evaporated as well from further sources.

In a further characteristic feature of the process, the molar ratio of metal complex to organic fluorescent emitter F may be not less than 1:10 and not more than 10:1. These ratios of metal complex to organic emitter within the layer have been found to be particularly advantageous for obtaining high luminances and a long lifetime of the layers. Higher proportions of metal complex can lead to an increase in the phosphorescence yield as a result of the change in layer conductivity, but this effect can also be achieved by other compounds with lower material costs. Lower proportions of metal complex, in contrast, can lead to only inadequate activation of the phosphorescence pathway. This may be disadvantageous for the internal quantum yield of the layer. Preferably, the molar ratio of metal complex to organic fluorescent emitter F is not less than 1:5 to 5:1 and additionally preferably 1:3 to 3:1.

In addition, the deposition of the metal complex and the organic fluorescent emitter F can be effected by means of a coevaporation process, and the deposition rate of the organic electronic layer may be not less than 0.1 Å/s and not more than 200 Å/s. The opening-up of the phosphorescence channel of the organic emitter is essentially coupled to the change in coordination of the heavy main group metal M as a result of the incorporation of or adduct formation with the organic emitter. The spatial proximity of the emitter to the metal enables spin-orbit coupling which leads to a reduced lifetime of excited triplet states of the organic emitter. It has been found that, surprisingly, these distances between emitter and metal can also be brought about by means of coevaporation. This is surprising because a prerequisite for the existence of high quantum yields would be expected to be a very well-defined separation, as, for example, in single crystals or in crystalline structures. However, this cannot be expected in the case of production by means of coevaporation, since the individual molecules are deposited in an unordered, amorphous manner within a layer. This process makes it possible to obtain solvent-free layers having a long lifetime. The preferred deposition rate may contribute to a homogeneous layer structure. Smaller deposition rates are not in accordance with the invention, since these would make the production much more expensive because of the time taken. Higher rates are additionally not in accordance with the invention since the quantum yield can be decreased because of inadequate establishment of the distance between metal and organic emitter. Preferably, the deposition rate may additionally be not less than 0.1 Å/s and not more than 150 Å/s and additionally preferably not less than 1.0 Å/s and not more than 100 Å/s.

Some embodiments provide a layer in an organic electronic component produced by the process of the invention. By means of the process of the invention, it is possible to produce layers in organic electronic components that are suitable for emission and conversion of light. The layers may have a layer thickness of not less than 1 nm and not more than 500 μm and be applied by means of the above-described processes. In the course of coevaporation processes, the layer is obtained by the direct application of the substances from the gas phase, whereas in wet processes the layer is obtained after evaporation of the solvent(s).

In addition, the layer of the invention may find use as an active layer in an organic electrical component for conversion of electrical current to light, of light to electrical current and of light to light of another wavelength. The layer of the invention can accordingly be utilized for generation of power by absorption of light waves, and also for production of light by means of an electrical current. In addition, the layer can also be utilized for conversion of light waves to light waves of another wavelength, for example by absorption of light quanta and release of light quanta of another wavelength.

Other embodiments provide an organic semiconductor component selected from the group comprising photodiodes, solar cells, organic light-emitting diodes, light-emitting electrochemical cells comprising the layer of the invention. The process described and the layers producible thereby may correspondingly find use for absorbent components such as photodiodes or solar cells. In addition, the layers may also be used for photo-conversion layers in photovoltaics or sensors. The process is compatible with the standard production steps for these components and it is possible in this way to inexpensively obtain long-lived and efficient components.

With regard to further features and advantages of the above-described organic semiconductor components, reference is hereby made explicitly to the elucidations in connection with the layer of the invention and the process of the invention. Also, features of the invention and advantages of the process of the invention should also be applicable and be considered to be disclosed for the layers of the invention and the organic semiconductor components of the invention, and vice versa. The invention also includes all combinations of at least two features disclosed in the description and/or the claims.

Examples

Within the process of the invention, an organic fluorescence emitter is made capable of phosphorescence-based emission or absorption of light by interaction with a heavy main group metal (In, Tl, Sn, Pb, Sb, Bi) within a layer or in solution. To illustrate the principle, compounds having the main group metals Bi, Pb and Sn are presented.

The organic fluorescence emitter used is 4,7-di(9H-carbazol-9-yl)-1,10-phenanthroline (BUPH1).
Characterization of the Organic Fluorescence Emitter BUPH1 is an uncharged, neutral organic molecule of the following structure:

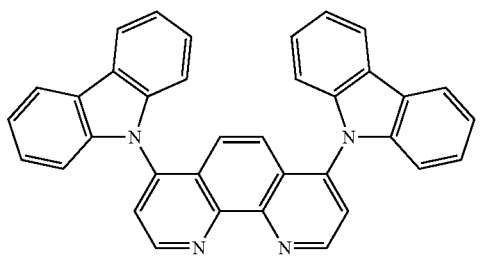 [SMILES: c1ccc2c(c1)c1ccccc1n2-c1ccnc2c1ccc1c(-n3c4ccccc4c4ccccc43)ccnc12]

where an electron-transporting phenanthroline core is bonded to two hole-transporting carbazole units. The compound is a bidentate Lewis base and the two nitrogen atoms of the core, just like the π electron systems of the aromatics, can interact with charged metals.

Figure 3:
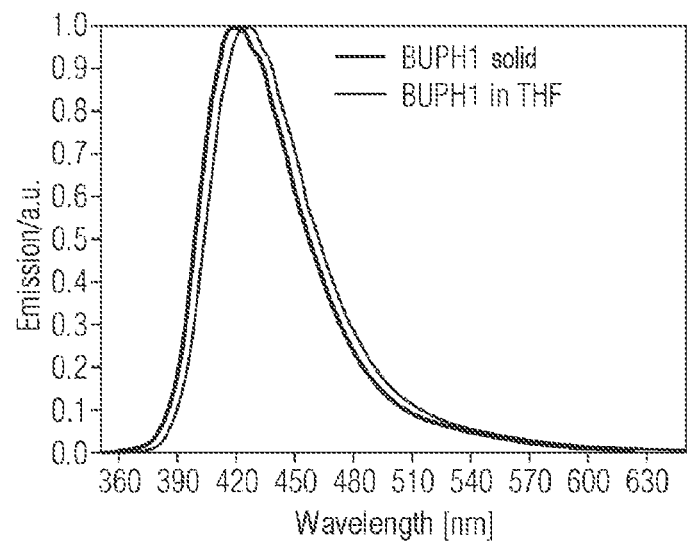
FIG. 3 shows the photoluminescence spectra of solid and THF-dissolved BUPH1 at room temperature.

FIG. 3 shows the spectra of solid BUPH1 and of BUPH1 dissolved in tetrahydrofuran (THF). BUPH1 at room temperature shows blue photoluminescence with a maximum emission of the solid material at 420 nm and of the THF-dissolved compound at 425 nm. The wavelength shift of 5 nm is caused by the polarity of the solvent chosen.

Figure 4:
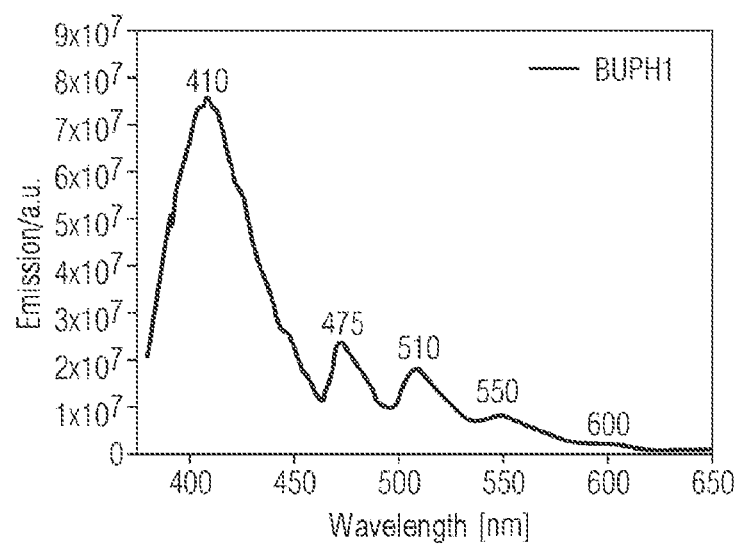
FIG. 4 shows the photoluminescence spectra of BUPH1 in 2-methyl-THF at 77 K.

FIG. 4 shows the photoluminescence spectrum of BUPH1 in 2-methyl-THF at 77 K. The compound shows 5 emission maxima at 410, 475, 510, 550 and 600 nm. Because of the fact that the maxima at 475, 510, 550 and 600 nm are well below that at 410 nm, it can be concluded that these emissions are from the triplet state and consequently originate from phosphorescence transitions (T1→S0). In general, this quantum yield is lower, since this transition is spin-forbidden. In addition, the Stokes shift of the emissions at 475, 510, 550 and 600 nm also suggests the presence of a phosphorescence transition of the BUPH1 at low temperatures. Phosphorescent transitions, compared to fluorescence transitions, are always lower in energy. In addition, the fact that the 475, 510, 550 and 600 nm emissions are absent at room temperature also suggests the presence of triplet emissions. It follows from this that the first emission maximum can be attributed to a fluorescence transition and the further transitions to phosphorescence transitions. The energy of the triplet transition is astonishingly very high at 2.6 eV (475 nm) compared to other Lewis bases.

The photoluminescence quantum yield (PLQY) of BUPH1 was determined in THF solution. The PLQY of a fluorophore (emitter) indicates the ratio between the number of photons emitted and absorbed. A method of calculation is given, for example, in Albert M. Brouwer, Pure Appl. Chem., vol. 83, no. 12, pp. 2213-2228, 2011. The BUPH1 PLQY in THF, using 9,10-diphenyl-anthracene in cyclohexane as reference, is 29.8%.

Figure 5:
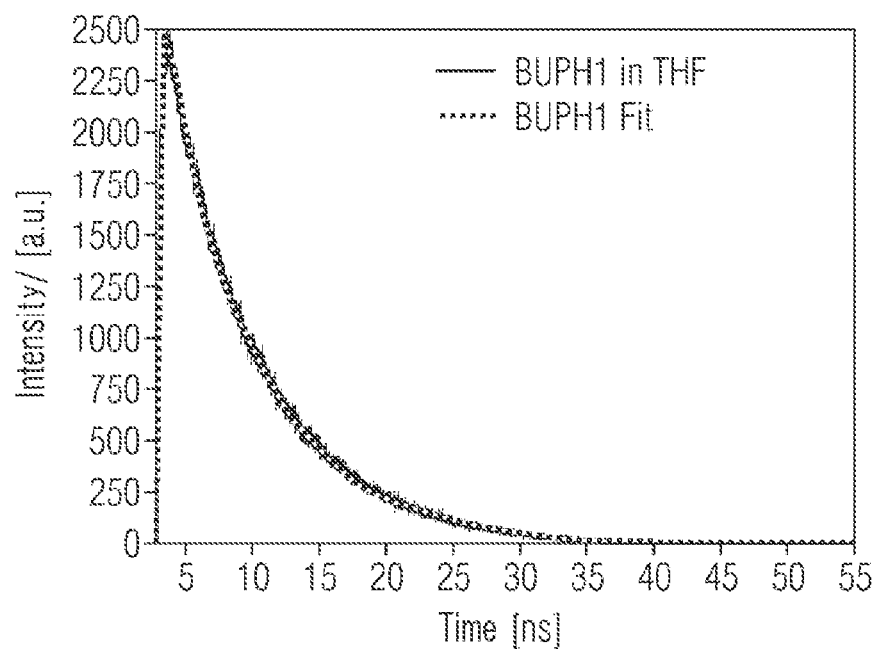
FIG. 5 shows the time-correlated single photon counting (TCSPC) spectrum of BUPH1 in THF for determination of the fluorescence lifetime of BUPH1.

FIG. 5 shows the time-correlated single photon counting (TCSPC) spectrum of BUPH1 in THF for determination of the fluorescence lifetime. The figure shows the exponential drop in photoluminescence as a function of time. The experiment was conducted in an inert atmosphere with $\lambda_{ex}$ 295 nm, $\lambda_{em}$ 420 nm and TAC 50 ns. The TAC ("time to amplitude", time/amplitude converter) is a part of the TCSPC spectrometer which produces an output signal having an amplitude proportional to the time interval between input "start" and "stop" pulses. The amplitude distribution of the output pulses is then recorded by a multichannel analyzer. It is thus a measure of the distribution of the time intervals between the start and stop pulses and is often referred to as "time spectrum". The data can be fitted with a single exponential function, which results in a lifetime of $7.06*10^{-9}$ s for BUPH1 in THF at room temperature (CHISQ=1.14). This means that the lifetime of the excited state at room temperature lies on a nanosecond scale, which corresponds to a fluorescence transition, having a typical lifetime of $10^{-9}$ up to $10^{-7}$ s.

Figure 6:
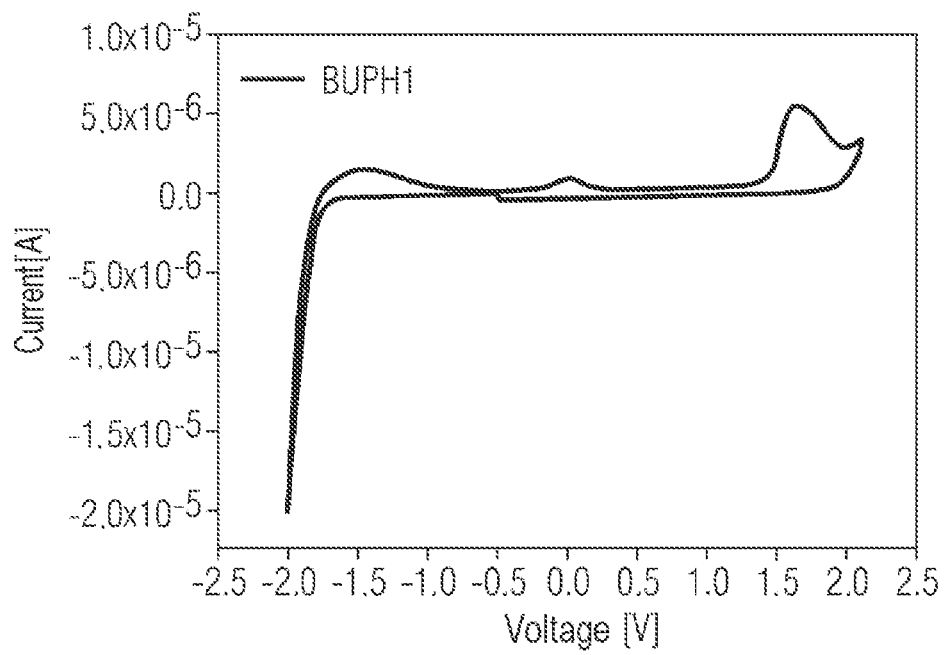
FIG. 6 shows the cyclic voltammogram of BUPH1 in acetonitrile.

FIG. 6 shows the cyclic voltammogram of BUPH1 in acetonitrile. The measurement was recorded with Pt/Pt electrodes against an Ag/AgCl reference electrode at a rate of 20 mV/s. The energy of the HOMO level can be calculated from the oxidation potential of BUPH1 (to BUPH1$^+$) of 1.43 V. A HOMO level of BUPH1 of 5.82 eV is obtained.

Figure 7:
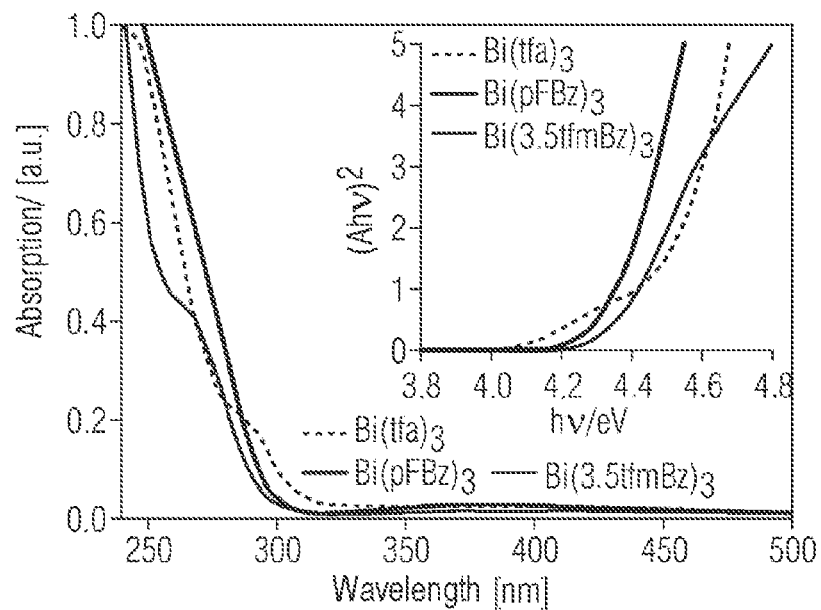
FIG. 7 shows the UV absorption spectra of $Bi(tfa)_3$, $Bi(pFBz)_3$ and $Bi(3,5tfmBz)_3$ together with a Tauc diagram.

A. Examples Using the Heavy Main Group Metal Bi
I. Characterization of the Metal Complexes Used FIG. 7 shows the UV absorption spectra of Bi(tfa)$_3$, Bi(pFBz)$_3$ and Bi(3,5tfmBz)$_3$. The structural formulae of the compounds are shown further down.

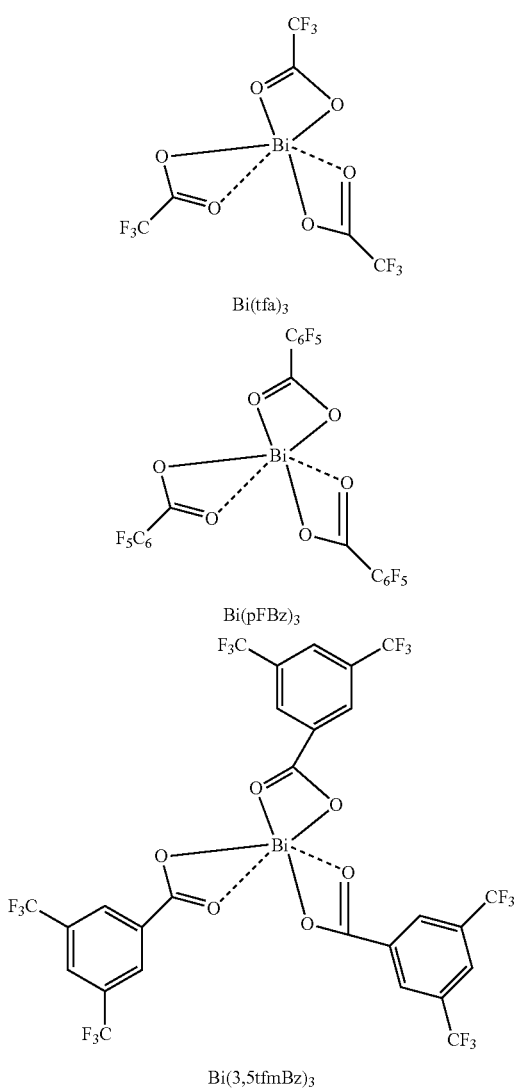

Bi(tfa)₃

Bi(pFBz)₃

Bi(3,5tfmBz)₃

The individual spectra show a strong n-π* and π-π* absorption which can be attributed to the carboxylate ligands and the central bismuth atom. The bismuth carboxylates absorb light only in the UV region of the spectrum, which is why they have the appearance of white solids. The graph inserted shows a Tauc plot with which the optical band gap of the individual compounds can be determined. The graphs show a linear regime which marks the starting point of the absorption. If this linear regime is extrapolated to the abscissa, the energy of the optical band gap is obtained. For Bi(tfa)₃, Bi(pFBz)₃ and Bi(3,5tfmBz)₃, a relatively large band gap in the region of 4.46, 4.32 and 4.34 eV is obtained. This shows that the bismuth carboxylates exhibit insulator properties.

Figure 8:
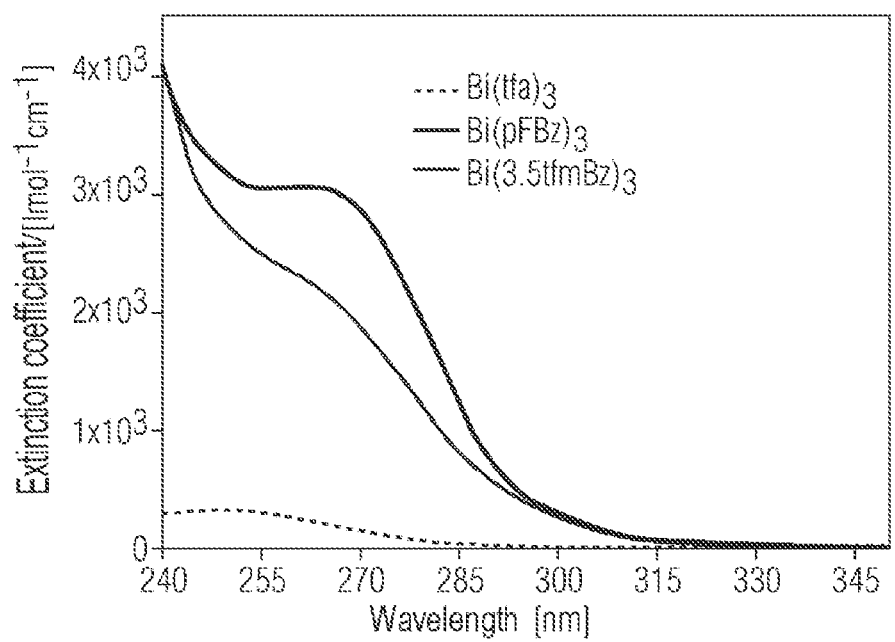
FIG. 8 shows the plot of the molar extinction coefficients of $Bi(tfa)_3$, $Bi(pFBz)_3$ and $Bi(3,5tfmBz)_3$ in THF against wavelength.

FIG. 8 shows the plot of the molar extinction coefficients of Bi(tfa)₃, Bi(pFBz)₃ and Bi(3,5tfmBz)₃ in THF against wavelength. At 265 nm, the extinction coefficients for Bi(tfa)₃, Bi(pFBz)₃ and Bi(3,5tfmBz)₃ are 243, 3065 and 2200 Lmol$^{-1}$ cm$^{-1}$. In the case of Bi(pFBz)₃ and of Bi(3,5tfmBz)₃, the n-π* and π-π* transitions are allowed, which leads to extinction coefficients exceeding 1000 Lmol$^{-1}$ cm$^{-1}$.

II. Production of the Layers

A prefabricated quartz substrate is treated by means of an oxygen plasma for 10 minutes and transferred as quickly as possible to an evaporator within an argon-filled glovebox having a water content less than 2 ppm.

The thermal evaporation is effected at a base pressure less than $2\times10^{-6}$ mbar, which is maintained over the entire vapor deposition step.

The metal complex and the organic emitter are simultaneously heated up to a temperature just below the evaporation point thereof. Subsequently, the metal complex is heated further until a constant evaporation rate is achieved. The same procedure is followed with the organic emitter and, with mutually constant evaporation rates, the evaporator slide valve is opened.

The deposition rate of the two substances is set to 1 Å/s, the concentration of the bismuth complex being regulated as a function of the desired Bi:BUPH1 ratio; for example, a concentration of 50% is achieved with a BUPH1 deposition rate of 0.5 Å/s and a Bi deposition rate of 0.5 Å/s. This corresponds to a ratio of 1:1.

After the vapor deposition, the two sources are cooled down to below 40° C. and the evaporator is flooded with dry argon.

A series of Bi:BUPH1 films with different composition was produced via the above-described coevaporation method. Thus, 200 nm-thick Bi:BUPH1 films were deposited as emitter layers on a piece of quartz glass. The following ratios were established (the abbreviation of bismuth(III) trifluoroacetate is Bi(tfa)₃ and that of Bi(III) pentafluorobenzoate is Bi(pFBz)₃):

| Compound | Ratio |
| --- | --- |
| Bi(tfa)₃:BUPH1 | 1:1 |
| Bi(tfa)₃:BUPH1 | 1:2 |
| Bi(tfa)₃:BUPH1 | 1:3 |
| Bi(tfa)₃:BUPH1 | 1:4 |
| Bi(tfa)₃:BUPH1 | 0:1 |
| Bi(tfa)₃:BUPH1 | 3:1 |
| Bi(pFBz)₃:BUPH1 | 1:1 |
| Bi(pFBz)₃:BUPH1 | 1:2 |
| Bi(pFBz)₃:BUPH1 | 1:3 |

III. Characterization of the Layers Produced by Coevaporation

III.a UV Absorption

Figure 9:
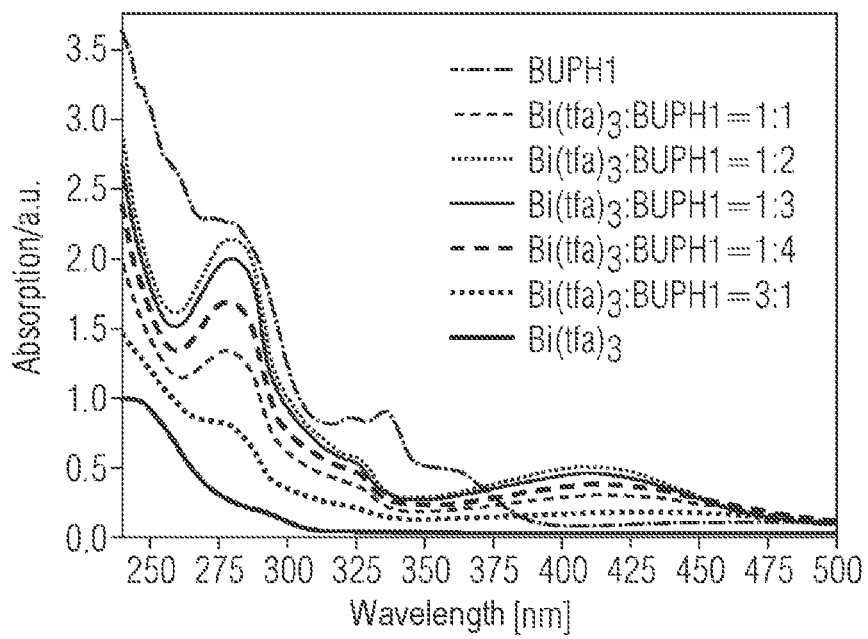
FIG. 9 shows the UV absorption spectra of BUPH1, $Bi(tfa)_3$ and $Bi(tfa)_3$:BUPH1 layers produced by coevaporation at different deposition rates.

FIG. 9 shows the UV absorption spectra of BUPH1, Bi(tfa)₃, and Bi(tfa)₃:BUPH1 layers produced by coevaporation with different deposition rates. The layer thickness is 200 nm. Two main absorption bands are visible for the films. The dominant absorption band lies between 230-350 nm and can be assigned to a spin-allowed π-π* transition in BUPH1. Compared to the pure BUPH1 film, the n-π* transition of BUPH1 at 335 nm is absent in the composite layers (metal+ emitter). This indicates coordination of the free nitrogen electron pairs to the bismuth. It follows from this that BUPH1 interacts with the bismuth to form an adduct or complex. In addition, the absorption spectrum of the composite films shows a low-lying absorption band at 350 nm-500 nm, which extends into the visible range. This band can probably be assigned to an intra-ligand charge transfer.

Figure 10:
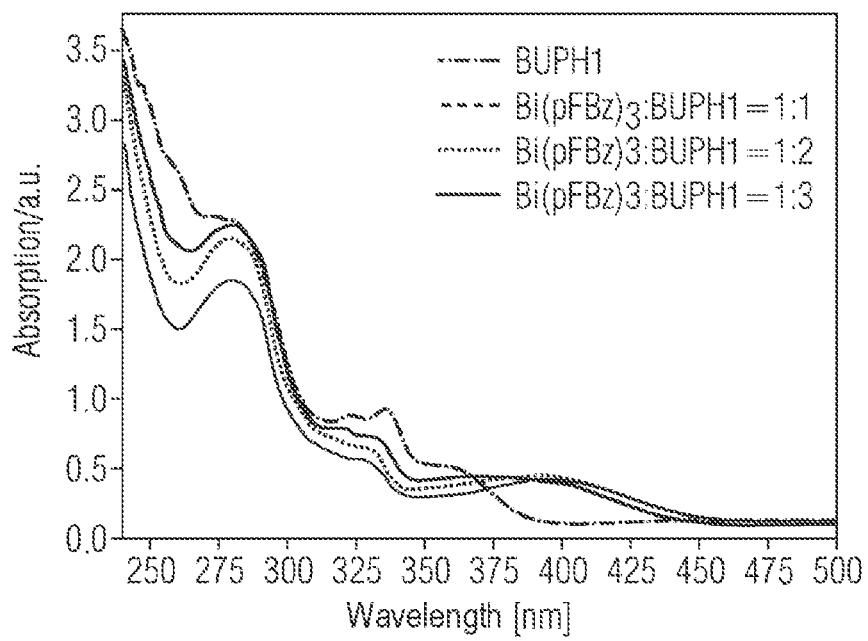
FIG. 10 shows the UV absorption spectra of BUPH1 and $Bi(pFBz)_3$:BUPH1 layers produced by coevaporation at different deposition rates.

FIG. 10 shows the UV absorption spectra of BUPH1 and of Bi(pFBz)₃:BUPH1 layers produced by coevaporation with different deposition rates. The layer thickness in each case is 200 nm. Compared to the pure BUPH1 film, the n-π* transition of BUPH1 at 335 nm is absent in the composite layers. This indicates coordination of the free nitrogen electron pair to the bismuth. It follows from this that BUPH1 binds/coordinates to the bismuth to form an adduct or complex. In addition, the absorption spectrum of the composite films shows a low-lying absorption band at 350 nm-500 nm, which extends into the visible range. This band can probably be assigned to an intra-ligand charge transfer.

III.b Photoluminescence

Figure 11:
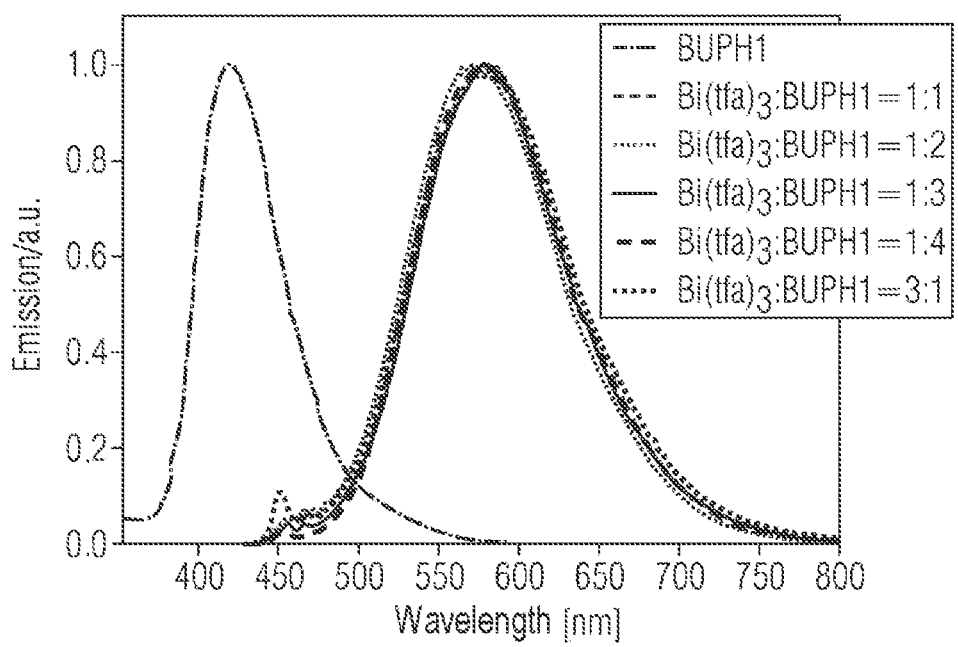
FIG. 11 shows the normalized photoluminescence spectrum of BUPH1 and $Bi(tfa)_3$:BUPH1 layers produced by coevaporation at different deposition rates.

FIG. 11 shows the normalized photoluminescence spectra of BUPH1 and of Bi(tfa)$_3$:BUPH1 layers produced by coevaporation with different deposition rates. The layer thickness in each case was 200 nm. The emission spectra are normalized to the maximum intensity of the BUPH1 film. The emission maximum for BUPH1 is at 420 nm and for the composite layers at 585 nm. BUPH1 film $\lambda_{ex}$: 365 nm, $\lambda_{em}$: 420 nm; Bi(tfa)$_3$:BUPH1=1:1 $\lambda_{ex}$: 410 nm, $\lambda_{em}$: 585 nm; Bi(tfa)$_3$:BUPH1=1:2 $\lambda_{ex}$: 410 nm, $\lambda_{em}$: 580 nm; Bi(tfa)$_3$:BUPH1=1:3 $\lambda_{ex}$: 410 nm, $\lambda_{em}$: 585 nm; Bi(tfa)$_3$:BUPH1=1:4 $\lambda_{ex}$: 410 nm, $\lambda_{em}$: 585 nm; Bi(tfa)$_3$:BUPH1=3:1 $\lambda_{ex}$: 410 nm, $\lambda_{em}$: 585 nm. Compared to the low-temperature emission spectrum of BUPH1, which had emission maxima at 520, 550 and 560 nm, the adduct or addition complex shows only one broad phosphorescence emission band at room temperature.

Figure 12:
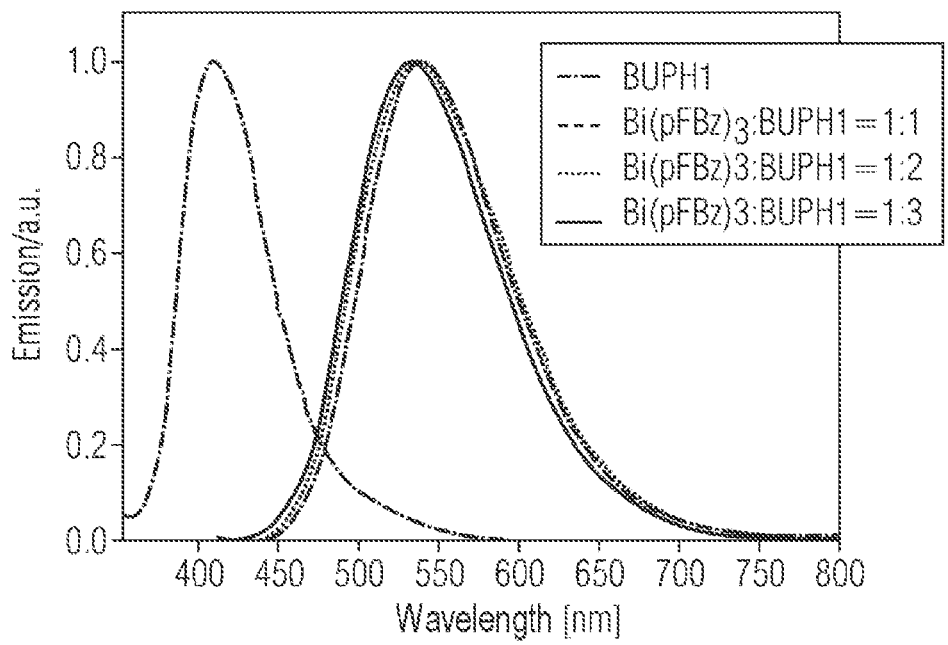
FIG. 12 shows the normalized photoluminescence spectrum of BUPH1 and $Bi(pFBz)_3$:BUPH1 layers produced by coevaporation at different deposition rates.

FIG. 12 shows the normalized photoluminescence spectra of BUPH1 and of Bi(pFBz)$_3$:BUPH1 layers produced by coevaporation with different deposition rates. The layer thickness in each case is 200 nm. BUPH1 $\lambda_{ex}$: 335 nm, $\lambda_{em}$: 420 nm; Bi(pFBz)$_3$:BUPH1=1:1 $\lambda_{ex}$: 395 nm, $\lambda_{em}$: 535 nm; Bi(pFBz)$_3$:BUPH1=1:2 $\lambda_{ex}$: 395 nm, $\lambda_{em}$: 542 nm; Bi(pFBz)$_3$:BUPH1=1:3 $\lambda_{ex}$: 395 nm, $\lambda_{em}$: 540 nm. The composite layers show a maximum emission at 550 nm. By comparison with FIG. 11, it is found that the emission at higher wavelengths is different between the different Bi complexes. This is probably because of the fact that the metal ligands (trifluoroacetate or pentafluoroacetate) can affect the emission wavelengths of the Bi:BUPH1 adduct or complex obtained. Compared to the low-temperature emission spectrum of BUPH1, which had emission maxima at 520, 550 and 560 nm, the complex shows only one broad phosphorescence emission band at room temperature.

III.c Photoluminescence Quantum Yield (PLQY)

The photoluminescence quantum yield (PLQY) of composite layers could not be determined in the solid state. For this reason, the layers of Bi(tfa)$_3$:BUPH1=1:2 and Bi(pFBz)$_3$:BUPH1=1:2 were dissolved in dichloromethane and the PLQY was measured in solution. The PLQY of Bi(tfa)$_3$:BUPH1=1:2 is 3.7% (Coumarin 153 in ethanol as reference). For Bi(pFBz)$_3$:BUPH1, the PLQY is 6% (Coumarin 153 in ethanol as reference). These PLQY values are well above the PLQYs of other bismuth complexes from the literature, which are generally below 1%. One example is a PLQY of 0.2% for dithienobismole, obtained according to WO 2011 111621 A1.

III.d Time-Correlated Single Photon Counting TCSPC

The Bi(tfa)$_3$:BUPH1 and Bi(pFBz)$_3$:BUPH1 films deposited with different compositions were examined by means of TCSPC (time-correlated single photon counting) measurements in an inert atmosphere. At room temperature, the TCSPC measurement for the Bi:BUPH1 films gives complex lifetimes in the microsecond range. This is a clear pointer to the presence of a phosphorescence transition. The results of the measurements on the individual films are shown in the following tables:

The Results for the Bi(tfa)$_3$:BUPH1 Films

| Film, 200 nm, 500 ns TAC range | | | | | | |
|---|---|---|---|---|---|---|
| Bi(tfa)$_3$:BUPH1 ratio | T1/s *10$^{-9}$ | B1/% | T2/s *10$^{-8}$ | B2/% | T3/s *10$^{-7}$ | B3/% |
| 1:1 | 2.68 | 46.96 | 2.03 | 15.70 | 1.42 | 21.05 |
| 1:2 | 3.80 | 10.00 | 2.98 | 11.27 | 1.46 | 71.08 |
| 1:3 | 3.58 | 21.48 | 2.54 | 15.16 | 1.27 | 54.08 |
| 1:4 | 2.46 | 32.35 | 3.10 | 14.89 | 1.21 | 28.56 |

The Results for the Bi(pFBz)$_3$:BUPH1 Films

| Film, 200 nm, 5 µs TAC range | | | | |
|---|---|---|---|---|
| Bi(pFBz)$_3$:BUPH1 ratio | T1/s *10$^{-7}$ | B1/% | T2/s *10$^{-6}$ | B2/% |
| 1:1 | 4.30 | 32.64 | 1.18 | 63.05 |
| 1:2 | 4.71 | 26.51 | 1.33 | 79.86 |
| 1:3 | 1.50 | 3.86 | 0.98 | 96.15 |

As can be seen from the graphs, it is apparent that the radiative lifetime of the emitters in the Bi(tfa)$_3$:BUPH1 films is somewhat shorter compared to the emitters in the Bi(pFBz)$_3$:BUPH1 films. It appears that the use of Bi(tfa)$_3$ leads to stronger spin-orbit coupling of the organic emitter, which more strongly allows the phosphorescence transition of BUPH1 in this complex in quantum-mechanical terms. This in turn leads to a shorter radiative lifetime compared to Bi(pFBz)$_3$. The Lewis acid character of Bi(tfa)$_3$ is higher compared to Bi(pFBz)$_3$, which leads to enhanced interaction in this example.

It should additionally be noted that the radiative lifetime of the emitters in the Bi(tfa)$_3$:BUPH1 films was fitted by means of a triexponential function, and that of the Bi(pFBz)$_3$:BUPH1 films with a diexponential function. This may indicate that a whole collection of molecules in the film is active and is involved in the emission.

III.e XRD Spectrum

Figure 13:
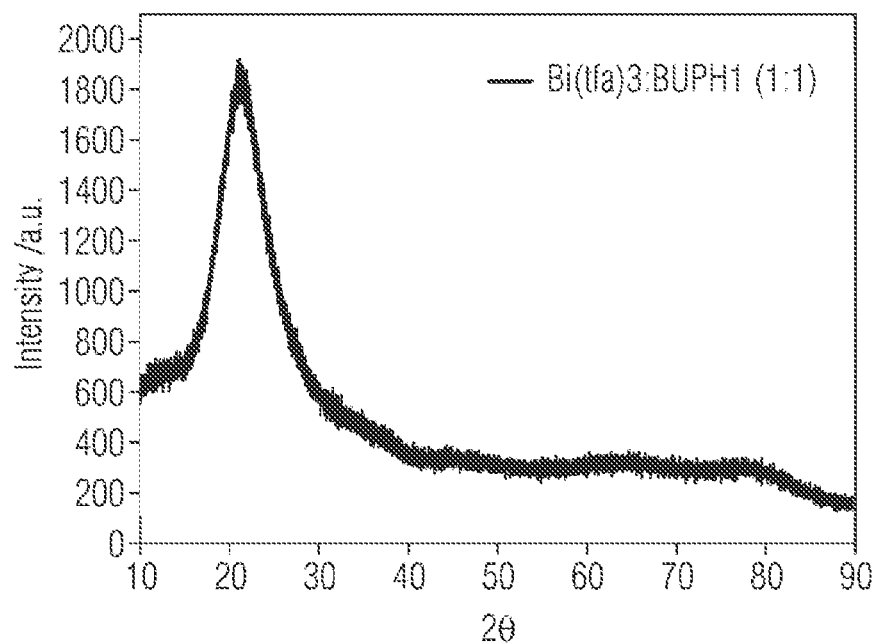
FIG. 13 shows the XRD spectrum of a $Bi(tfa)_3$:BUPH1 (1:1) film.

FIG. 13 shows the XRD spectrum of a Bi(tfa)$_3$:BUPH1 (1:1) film. The layer thickness of the Bi(tfa)$_3$:BUPH1 (1:1) film is 2 µm. The film generates only a broad halo over a wide 2 theta range in the x-ray diffractogram, which suggests an amorphous arrangement of the metal complex-emitter compounds. This means that the individual phosphorescent assemblies are arranged in an irregular, amorphous manner in the layer. This may be attributable to the fact that the compounds in the film are of mixed stoichiometry, or that no long-range order can be established between the individual emitter assemblies because of the preparation methodology chosen.

B. Examples Using the Heavy Main Group Metal Sn

As a further example of emitters which contain a heavy main group metal and have phosphorescence at room temperature, Sn compounds are used. The metal starting material used was tin(II) chloride (SnCl$_2$). BUPH1 is an organic fluorescent emitter which interacts with the heavy atom via weak electrostatic and/or π interactions. The influence of the heavy metal allows hitherto spin-forbidden electronic transitions of BUPH1 in quantum-mechanical terms, and a significant phosphorescence contribution at room temperature is obtained. These results show the suitability in principle of this class of compound for use in layers of organic electrical components as well.

I. Preparation of Sn-BUPH1 composite solutions in THF $SnCl_2$ and BUPH1 are allowed to react in 3 mL of tetrahydrofuran (THF) solution in a ratio of 1:1, 1:2 or 1:3, and this solution is then analyzed spectroscopically. 5 μL of $SnCl_2$ ($10^{-2}$ M in THF) and 5 μL of BUPH1 ($10^{-2}$ M in THF) in 3 mL of THF were used, in order to establish a molar ratio of 1:1.

II. Characterization of the Solutions Prepared

II.a UV Absorption

Figure 14:
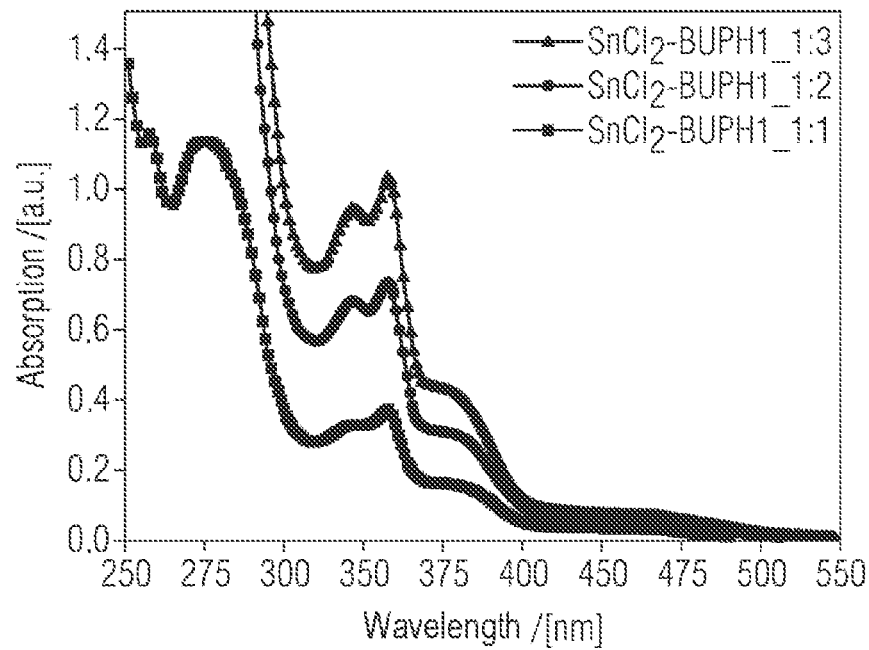
FIG. 14 shows the UV absorption spectra in the range between 250 and 475 nm of $SnCl_2$-BUPH1 adducts or complexes with different composition. What are shown are the UV absorption spectra of 1:1, 1:2 and 1:3 adducts or complexes in THF at room temperature.
Figure 15:
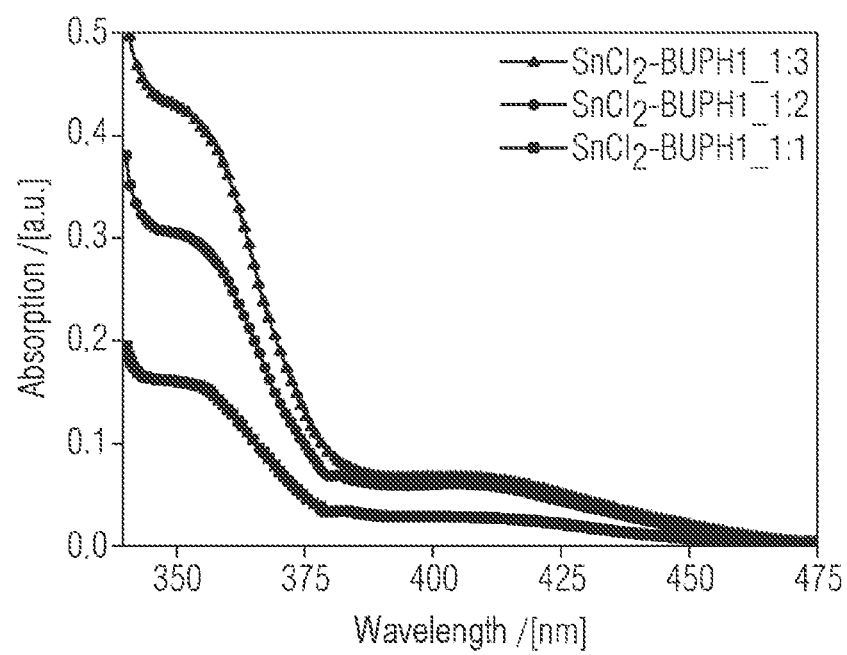
FIG. 15 shows the UV absorption spectra in the range between 350 and 475 nm of $SnCl_2$-BUPH1 adducts or complexes with different composition. What are shown are the UV absorption spectra of 1:1, 1:2 and 1:3 adducts or complexes in THF at room temperature. The data correspond to the results from FIG. 14 and are merely enlarged and shown in sections.

FIG. 14 shows the UV absorption spectra of $SnCl_2$-BUPH1 in THF in different molar ratios (1:1, 1:2 and 1:3). The absorption bands in the composite THF solutions of $SnCl_2$-BUPH1 between 250-375 nm are identical to the optical transitions of BUPH1 (cf. FIG. 3) in this region. The increase in intensity of the absorption bands of $SnCl_2$-BUPH1 is proportional to the concentration of BUPH1 in the solution. Interestingly, the absorption spectrum of the composite THF solutions additionally shows a low-lying absorption band in the range of 375-450 nm, which extends into the visible range. This region is shown in enlarged form in FIG. 15. This band can probably be assigned to an intra-ligand charge transfer of the BUPH1-Sn adduct or addition complex formed.

II.b Photoluminescence

Figure 16:
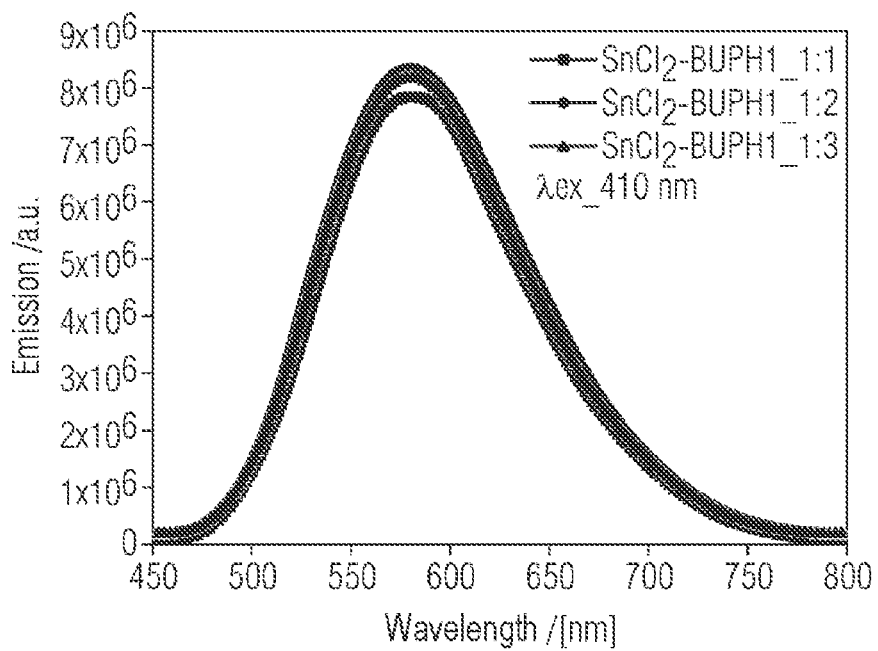
FIG. 16 shows the normalized photoluminescence spectrum of $SnCl_2$-BUPH1 adducts or complexes with different composition (1:1, 1:2 and 1:3) in THF at room temperature. The excitation wavelength was 410 nm.

FIG. 16 shows the photoluminescence spectra of $SnCl_2$-BUPH1 in THF solution in a molar ratio of 1:1, 1:2 and 1:3. The excitation wavelength for the spectra was 410 nm, since the intra-ligand charge transfer probably takes place at this wavelength, which is found to be responsible for the phosphorescence emission band. The composite THF solutions show a maximum emission at 580 nm and the intensity of the bands barely changes with the increase in the concentration of the BUPH1 in solution. Without being bound by the theory, the emission is caused mainly by BUPH1, which is made capable of phosphorescence because of the effect of the heavy metal tin on the spin-forbidden electronic transitions. Compared to the low-temperature emission spectrum of BUPH1 (cf. FIG. 4), which has emission maxima at 520, 550 and 600 nm, the $SnCl_2$-BUPH1 adduct or addition complex shows a broad phosphorescence emission band at room temperature.

II.c Time-Correlated Single Photon Counting TCSPC

Figure 17:
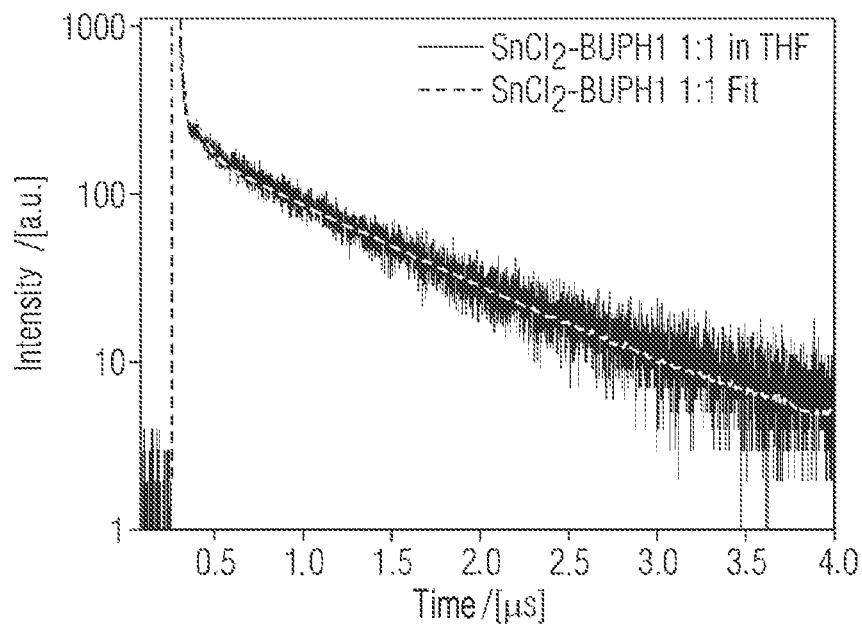
FIG. 17 shows the time-correlated single photon counting (TCSPC) spectrum of 1:1 $SnCl_2$-BUPH1 adducts or complexes in THF at room temperature. Additionally shown is the mathematical fit.
Figure 18:
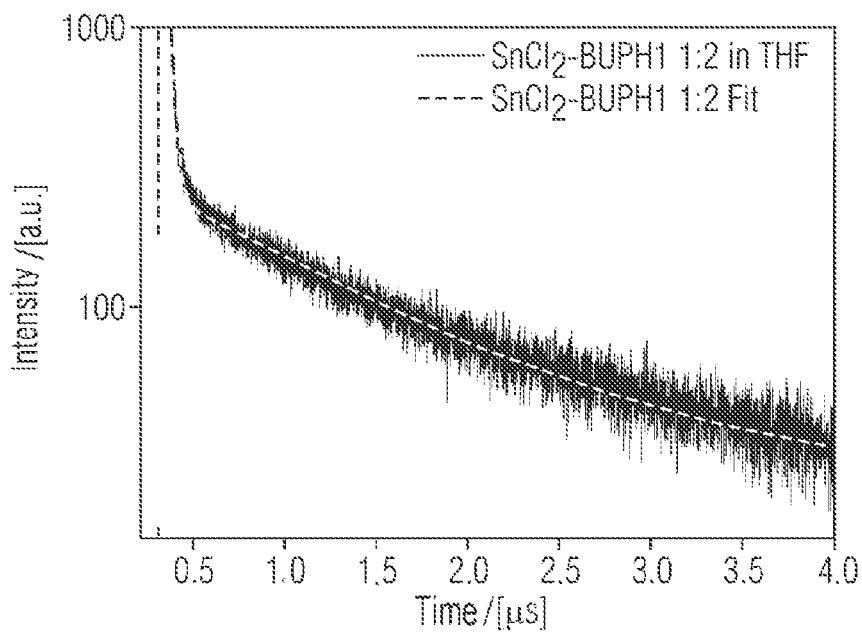
FIG. 18 shows the time-correlated single photon counting (TCSPC) spectrum of 1:2 $SnCl_2$-BUPH1 adducts or complexes in THF at room temperature. Additionally shown is the mathematical fit.
Figure 19:
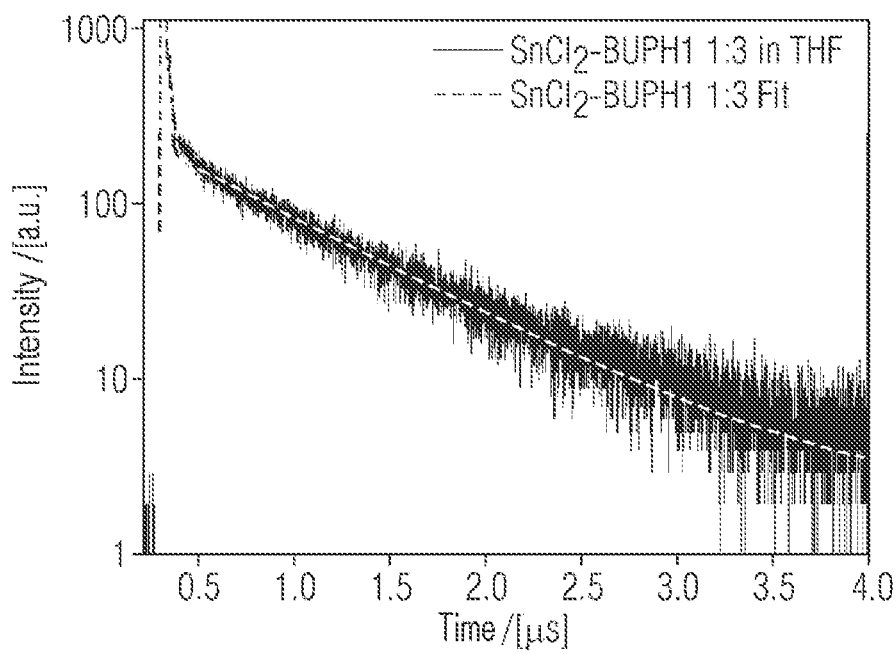
FIG. 19 shows the time-correlated single photon counting (TCSPC) spectrum of 1:3 $SnCl_2$-BUPH1 adducts or complexes in THF at room temperature. Additionally shown is the mathematical fit.

The $SnCl_2$-BUPH1 solutions prepared with different molar ratios were examined by means of time-correlated single photon counting measurements in an inert atmosphere (argon). At room temperature, the TCSPC measurement for the $SnCl_2$-BUPH1 adducts or addition complexes gives lifetimes in the microsecond range (ratio 1:1 in FIG. 17, 1:2 in FIG. 18 and 1:3 in FIG. 19). This is a clear pointer to the presence of a phosphorescence transition. The results of the measurements on the individual samples are shown in the table below.

| Molar $SnCl_2$-BUPH1 ratio | T1/μs |
| --- | --- |
| 1:1 | 0.84 |
| 1:2 | 1.12 |
| 1:3 | 0.76 |

The spectra were measured on a 5 μs timescale, with variation in the phosphorescence lifetime of the composite THF solutions examined in the range from 0.76 to 1.12 μs.

C. Examples Using the Heavy Main Group Metal Pb

As a further example of emitters which contain a heavy main group metal and have phosphorescence at room temperature, Pb compounds are used. These results show the suitability in principle of this class of compound for use in layers of organic electrical components as well.

I Preparation of Pb-BUPH1 Composite Solutions in THF

PbTFA (lead trifluoroacetate) and BUPH1 are allowed to react in 3 mL of THF solution in a ratio of 1:1, 1:2 or 1:3 and the solution is then analyzed spectroscopically. 5 μL of PbTFA ($10^{-2}$ M in THF) and 5 μL of BUPH1 ($10^{-2}$ M in THF) in 3 mL of THF were used, in order to establish a molar ratio of 1:1.

II. Characterization of the Solutions Prepared

II.a UV Absorption

Figure 20:
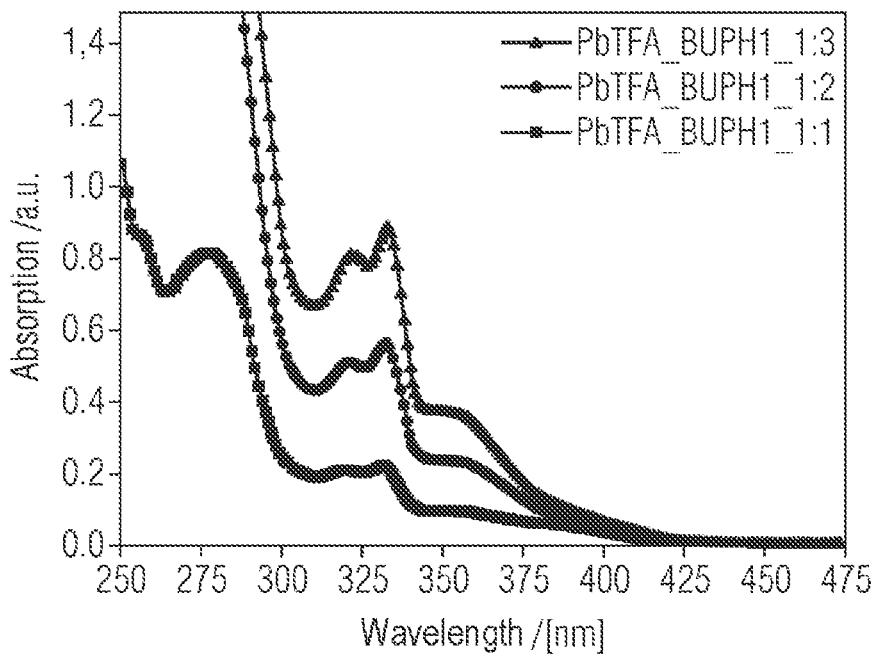
FIG. 20 shows the UV absorption spectra in the range between 250 and 475 nm of PbTFA-BUPH1 adducts or complexes with different composition. What are shown are the UV absorption spectra of 1:1, 1:2 and 1:3 adducts or complexes in THF at room temperature.
Figure 21:
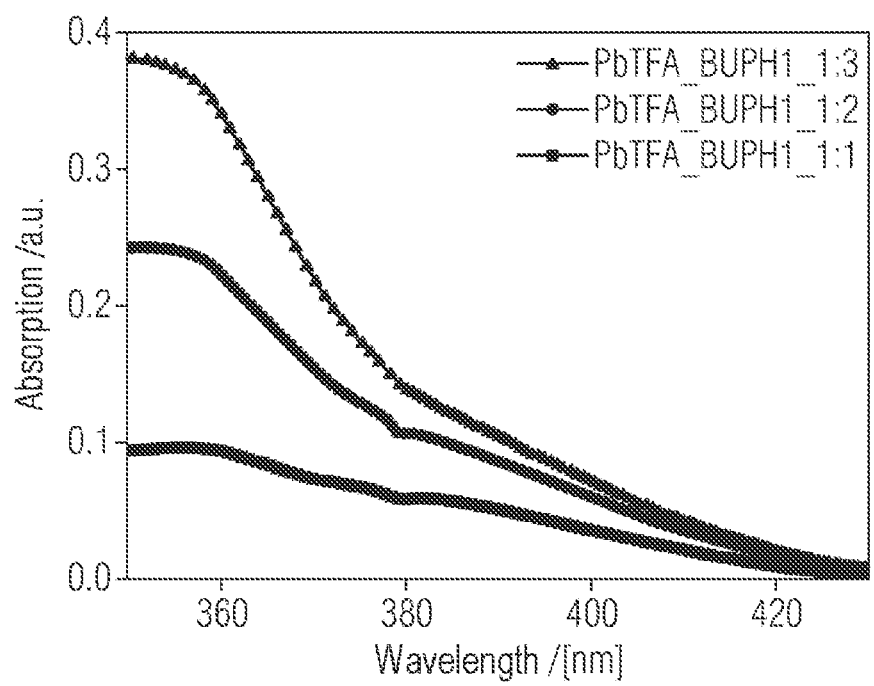
FIG. 21 shows the UV absorption spectra in the range between 350 and 430 nm of PbTFA-BUPH1 adducts or complexes with different composition. What are shown are the UV absorption spectra of 1:1, 1:2 and 1:3 adducts or complexes in THF at room temperature. The data correspond to the results from FIG. 20 and are merely enlarged and shown in sections.

FIGS. 20 and 21 show the UV-VIS absorption spectra of PbTFA-BUPH1 in THF in a molar ratio of 1:1, 1:2 and 1:3.

The absorption bands in the composite THF solutions of PbTFA-BUPH1 between 250-375 nm are identical to the optical transitions of BUPH1 in this region. The increase in intensity of the absorption bands of PbTFA-BUPH1 is proportional to the concentration of BUPH1 in the solution. Interestingly, the absorption spectrum of the composite THF solutions additionally shows a low-lying absorption band in the range of 375-415 nm (FIG. 21), which extends into the visible range. This band can probably be assigned to an intra-ligand charge transfer of the BUPH1-Pb adduct or addition complex formed.

II.b Photoluminescence

Figure 22:
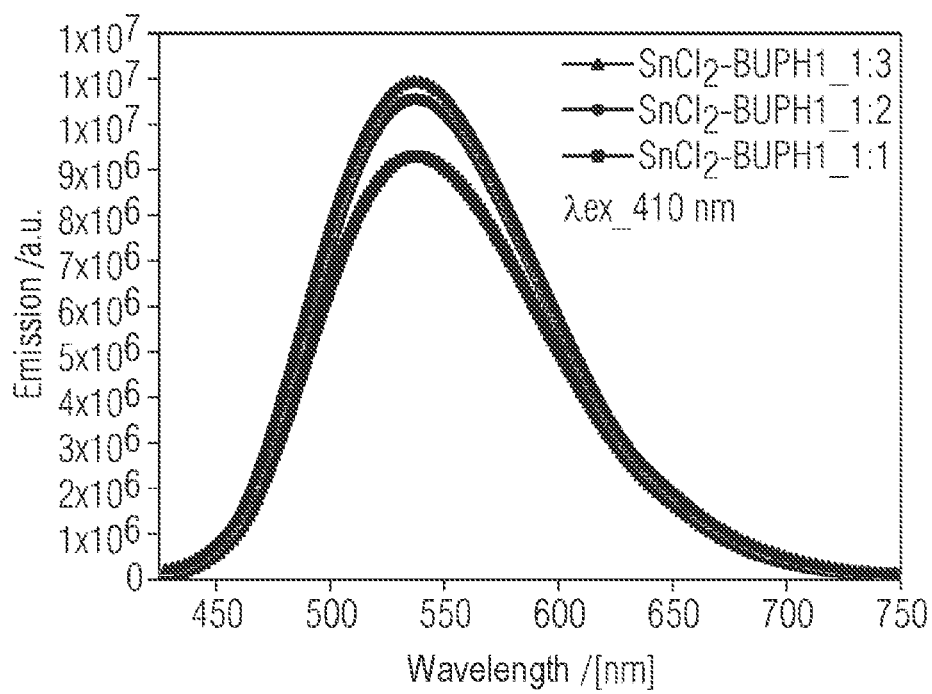
FIG. 22 shows the normalized photoluminescence spectrum of PbTFA-BUPH1 adducts or complexes with different composition (1:1, 1:2 and 1:3) in THF at room temperature. The excitation wavelength was 410 nm.

FIG. 22 shows the photoluminescence spectra of PbTFA-BUPH1 in THF solution in a molar ratio of 1:1, 1:2 and 1:3. The compounds were excited with a wavelength of 410 nm, since the intra-ligand charge transfer probably takes place at this wavelength, which is found to be responsible for the phosphorescence emission band. The composite THF solutions show a maximum emission at 536 nm and the intensity of the bands barely changes with the increase in the concentration of the BUPH1 in solution. Without being bound by the theory, the emission is caused mainly by BUPH1, which is made capable of phosphorescence because of the effect of the heavy metal lead on the spin-forbidden electronic transitions. Compared to the low-temperature emission spectrum of BUPH1 (see FIG. 3), which has emission maxima at 520, 550 and 600 nm, the PbTFA-BUPH1 adduct or addition complex shows a broad phosphorescence emission band at room temperature.

II.c Time-Correlated Single Photon Counting TCSPC

Figure 23:
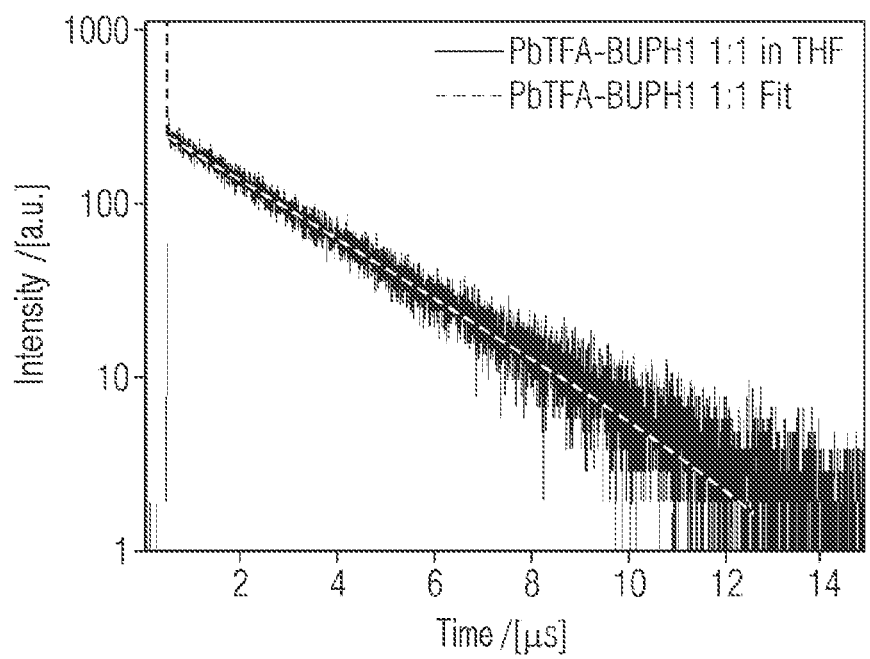
FIG. 23 shows the time-correlated single photon counting (TCSPC) spectrum of 1:1 PbTFA-BUPH1 adducts or complexes in THF at room temperature. Additionally shown is the mathematical fit.
Figure 24:
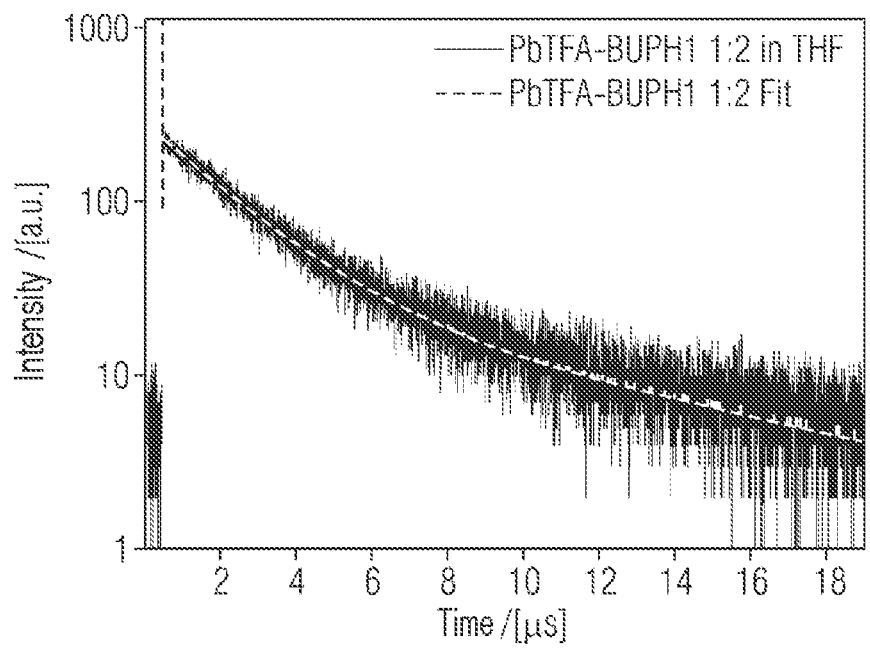
FIG. 24 shows the time-correlated single photon counting (TCSPC) spectrum of 1:2 PbTFA-BUPH1 adducts or complexes in THF at room temperature. Additionally shown is the mathematical fit.
Figure 25:
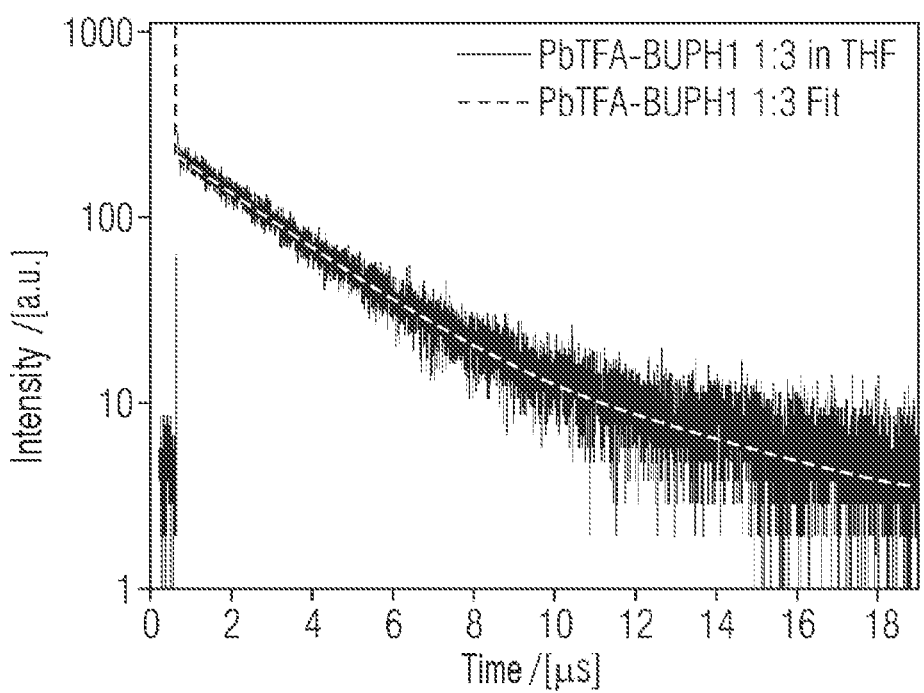
FIG. 25 shows the time-correlated single photon counting (TCSPC) spectrum of 1:3 PbTFA-BUPH1 adducts or complexes in THF at room temperature. Additionally shown is the mathematical fit.

The PbTFA-BUPH1 solutions prepared with different molar ratios were examined by means of time-correlated single photon counting measurements in an inert atmosphere (argon). At room temperature, the TCSPC measurement for the PbTFA-BUPH1 adducts or addition complexes gives lifetimes in the microsecond range (ratio 1:1 in FIG. 23, 1:2 in FIG. 24 and 1:3 in FIG. 25). This is a clear pointer to the presence of a phosphorescence transition. The results of the measurements on the individual samples are shown in the table below.

| Molar PbTFA:BUPH1 ratio | T1/μs |
| --- | --- |
| 1:1 | 2.61 |
| 1:2 | 9.58 |
| 1:3 | 52.56 |

The spectra were measured on a 20 μs timescale, with variation in the phosphorescence lifetimes of the composite THF solutions examined in the range from 2.61 to 52.56 microseconds.

Even though the invention has been illustrated in detail and described by the preferred working example, the invention is not restricted by the examples disclosed and other variations can be derived therefrom by the person skilled in the art without leaving the scope of protection of the invention.

What is claimed is:

1. A process for producing organic electronic layers including organic emitters that are phosphorescent at room temperature, the process comprising:
    providing organic fluorescent emitters comprising organic molecules having either a partial or overall aromatic character with delocalized π electrons,
    providing metal complexes containing organic complex ligands and at least one heavy main group metal selected from the group consisting of In, Tl, Sn, Pb, Sb and Bi, and
    codepositing, in a single layer on a substrate, (a) the organic fluorescent emitters together with (b) the metal complexes containing organic complex ligands and the at least one heavy main group metal,
    wherein combining the metal complexes containing the organic complex ligands and the at least one heavy main group metal with the organic fluorescent emitters via the codepositing step causes an alteration of the coordination sphere of the heavy main group metal including at least one of (a) an increase in a number of pairs of coordinated ligands and emitters or (b) a replacement of one or more of the organic complex ligands of the metal complexes by the organic fluorescent emitters.

2. The process of claim 1, wherein the heavy main group metal comprises Bi.

3. The process of claim 1, wherein the organic electronic layers exhibit a proportion of phosphorescent emission caused by electronic inter- and intra-ligand transfers with purely electronic excitation of not less than 20% and not more than 100%.

4. The process of claim 1, wherein the organic fluorescent emitters comprise substituted or unsubstituted C6-C60 aromatics or heteroaromatics.

5. The process of claim 1, wherein the organic fluorescent emitter is 4,7-di(9H-carbazol-9-yl)-1,10-phenanthroline (BUPH1).

6. The process of claim 1, wherein the ligands of the metal complex are independently selected from the group consisting of (a) halides and (b) fluorinated or nonfluorinated C2-C20 alkyl or aryl carboxylates, alkoxides, thiolates, cyanates, isocyanates, thiocyanates, acetylacetonates, or sulfonates.

7. The process of claim 1, wherein the metal complex comprises one or more compounds selected from the group consisting of Bi(III) fluorobenzoate, Bi(III) fluoroalkylbenzoate, Bi(III) fluorodialkylbenzoate, Bi(III) fluorotrialkylbenzoate, Bi(III) pentafluorobenzoate, and Bi(III) 3,5-trifluoromethylbenzoate.

8. The process of claim 1, wherein the metal complex comprises one or more triarylbismuth(V) carboxylates.

9. The process of claim 1, wherein the metal complex comprises Bi(III) triscarboxylate, Bi(III) fluoroacetate, or Bi(III) trifluoroacetate.

10. The process of claim 1, comprising depositing the metal complex and the organic fluorescent emitter on a carrier substrate by coevaporation, rotary or curtain coating, bar coating, or printing.

11. The process of claim 10, wherein the organic electronic layers have a molar ratio of metal complex to organic fluorescent emitter F of not less than 1:10 and not more than 10:1.

12. The process of claim 10, comprising depositing the metal complex and the organic fluorescent emitter using a coevaporation process with a deposition rate of the organic electronic layer of not less than 0.1 Å/s and not more than 200 Å/s.

13. The process of claim 1, wherein combining the metal complexes containing the organic complex ligands and the at least one heavy main group metal with the organic fluorescent emitters via the codepositing step further causes an alteration in a HOMO/LUMO energy level of at least some organic fluorescent emitters.

14. The process of claim 1, wherein the metal complexes comprise organic complex ligands having terminal, bidentate, tridentate or heterobimetallic bridging to respective heavy metal atoms.

15. The process of claim 1, wherein the metal complexes comprise organic complex ligands bonded to heavy metal atoms via oxygen atoms.

* * * * *